United States Patent [19]
Takahashi

[11] Patent Number: 5,981,981
[45] Date of Patent: *Nov. 9, 1999

[54] SEMICONDUCTOR DEVICE INCLUDING A BIPOLAR STRUCTURE

[75] Inventor: Hideki Takahashi, Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/921,516

[22] Filed: Sep. 2, 1997

Related U.S. Application Data

[63] Continuation of application No. 08/658,637, Jun. 5, 1996, abandoned, which is a continuation-in-part of application No. 08/441,787, May 16, 1995, Pat. No. 5,569,941, which is a continuation of application No. 08/135,471, Oct. 13, 1993, abandoned.

[30] Foreign Application Priority Data

Dec. 11, 1995 [JP] Japan ............................. 7-321898 (P)

[51] Int. Cl.[6] .......................... H01L 29/74; H01L 31/111; H01L 27/082; H01L 27/102
[52] U.S. Cl. ......................... 257/133; 257/138; 257/139; 257/341; 257/565; 257/332; 257/334
[58] Field of Search .................................. 257/133, 341, 257/138, 139, 330–332, 334

[56] References Cited

U.S. PATENT DOCUMENTS

| | | | |
|---|---|---|---|
| 5,200,638 | 4/1993 | Kida et al. .............................. | 257/368 |
| 5,397,905 | 3/1995 | Otsuki et al. ........................... | 257/133 |
| 5,485,022 | 1/1996 | Matsuda .................................. | 257/133 |
| 5,569,941 | 10/1996 | Takahashi ............................... | 257/133 |

FOREIGN PATENT DOCUMENTS

| | | |
|---|---|---|
| 0 398 120 | 11/1990 | European Pat. Off. . |
| 0 594 049 | 4/1994 | European Pat. Off. . |
| 61-216363 | 9/1986 | Japan . |
| 1-282872 | 11/1989 | Japan . |
| 6-204481 | 7/1994 | Japan . |

OTHER PUBLICATIONS

Patent Abstracts of Japan, vol. 009, No. 089 (E–309), Apr. 18, 1985, JP 59 219963, Dec. 11, 1984.

Patent Abstracts of Japan, vol. 013, No. 564 (E–860), Dec. 14, 1989, JP 01 235272, Sep. 20, 1989.

*Primary Examiner*—Mahshid Saadat
*Assistant Examiner*—Allan R. Wilson
*Attorney, Agent, or Firm*—Oblon, Spivak, McClelland, Maier & Neustadt, P.C.

[57] ABSTRACT

A high concentration n-type semiconductor region (21) having a width (W) and a distance (D) of constant ranges is selectively formed to be overlapped with or adjacent to a buffer layer (2). When a thickness (L) of an n-type semiconductor layer (3) is 50 μm and the distance (D) is 3 μm, for example, the width (W) is set in the range of 3 μm to 7 μm. In this case, a saturation voltage ($V_{CE}(sat)$) and a fall time ($t_f$) are improved best as compared with a conventional device having no high concentration n-type semiconductor region (21). Thus, the saturation voltage ($V_{CE}(sat)$) and the fall time ($t_f$) are compatibly reduced.

21 Claims, 21 Drawing Sheets

107

108

153

SEMICONDUCTOR DEVICE INCLUDING A BIPOLAR STRUCTURE

This application is a Continuation of application Ser. No. 08/658,637, filed on Jun. 5, 1996, now abandoned, which is a continuation-in-part of application Ser. No. 08/441,787, filed May 16, 1995, now U.S. Pat. No. 5,569,941, which is a continuation of application Ser. No. 08/135,471, filed Oct. 13, 1993, now abandoned.

BACKGROUND OF THE INVENTION

1. Field of the Invention

The present invention relates to a semiconductor device having a bipolar structure, and more particularly, it relates to an improvement for compatibly reducing a saturation voltage and a fall time.

2. Description of the Background Art

Generally known is a semiconductor device comprising a semiconductor body, a pair of main electrodes which are connected to a pair of major surfaces of the semiconductor body, and a bipolar structure, formed in the semiconductor body, consisting of p-type and n-type semiconductor layers which are alternately stacked in three layers along the major surfaces. An IGBT, an EST (emitter switched thyristor), an MCT (MOS controlled thyristor), an SIT and a GTO are typical examples thereof.

FIG. 36 is a front sectional view showing the structure of a conventional n-channel IGBT. In a general IGBT, a number of IGBT elements (hereinafter referred to as unit cells) are connected in parallel with each other. FIG. 36 is a sectional view showing a single unit cell. In this IGBT 151, an n-type buffer layer 2 and an n-type semiconductor layer 3 which is exposed on an upper major surface of a semiconductor body 12 are successively stacked on an upper major surface of a p-type semiconductor layer 1 which is exposed on a lower major surface of the semiconductor body 12. When the rated voltage is 600 V, the n-type semiconductor layer 3 has an n-type impurity concentration of about $2 \times 10^{14}$ cm$^{-3}$, while the buffer layer 2 is set at an n-type impurity concentration of about $1 \times 10^{17}$ cm$^{-3}$, which is higher than that of the n-type semiconductor layer 3.

Further, a p-type base layer 4 is selectively formed on an upper major surface portion of the n-type semiconductor layer 3. A pnp bipolar structure is formed by the p-type semiconductor layer 1, the n-type semiconductor layers 2 and 3 and the p-type base layer 4. Further, an n-type emitter region 5 is selectively formed on an upper major surface portion of the p-type base layer 4. On a channel region 6 which is an upper major surface portion of the p-type base layer 4 held by the n-type semiconductor layer 3 and the n-type emitter region 5, a gate electrode 8 is provided to be opposed thereto through a gate insulating film 7.

In addition, an emitter electrode 9 which is a first main electrode is formed on the upper major surface of the semiconductor body 12, to be electrically connected to both of the p-type base layer 4 and the n-type emitter region 5. On the other hand, a collector electrode 10 which is a second main electrode is electrically connected to the lower major surface of the semiconductor body 12, i.e., that of the p-type semiconductor layer 1.

An operation of this conventional device 151 is now described. First, a prescribed collector voltage $V_{CE}$ is applied across the emitter electrode 9 and the collector electrode 10. A gate voltage $V_{GE}$ exceeding a threshold value which is specific to the device is applied across the emitter electrode 9 and the gate electrode 8 at this time, whereby the channel region 6 of the p-type base layer 4 which is in proximity to the gate electrode 8 is reversed to an n-type, and an n-type channel is formed in the channel region 6.

Through this channel, electrons serving as carriers are injected from the emitter electrode 9 into the n-type semiconductor layer 3. The p-type semiconductor layer 1 and the n-type semiconductor layer 3 are forward-biased by the injected electrons, whereby holes serving as carriers are injected from the p-type semiconductor layer 1 into the n-type semiconductor layer 3. Consequently, the resistance of the n-type semiconductor layer 3 is remarkably reduced, and a main current flowing from the collector electrode 10 to the emitter electrode 9, i.e., a collector current $I_C$, reaches a high value. Namely, the device enters a conducting state (is turned on). Thus, the resistance of the n-type semiconductor layer 3 is reduced by the injection of the holes from the p-type semiconductor layer 1 in the IGBT.

The resistance across the emitter electrode 9 and the collector electrode 10 in the ON state of the device is called ON-state resistance. In general, such ON-state resistance is evaluated through the collector voltage $V_{CE}$ (called a saturation collector voltage $V_{CE}(sat)$) which appears when the collector current $I_C$ is at a rated current value. In general, the rated current of the IGBT is typically about 50 to 200 A/cm$^2$. The saturation voltage $V_{CE}(sat)$, which causes power loss at an ON time, is preferably minimized.

Under a state of applying the gate voltage $V_{GE}$ of a constant magnitude, limitation of a constant amount corresponding to the gate voltage $V_{GE}$ is added to the flow rate of electrons flowing in the channel region 6 when the collector voltage $V_{CE}$ is increased. Therefore, the collector current $I_C$ flowing through the device is saturated at a constant value (called a saturation collector current $I_C(sat)$) corresponding to the gate voltage $V_{GE}$.

The buffer layer 2 which is in contact with the p-type semiconductor layer 1 is adapted to control the amount of the holes injected from the p-type semiconductor layer 1. Since the buffer layer 2 has a high n-type impurity concentration, the holes injected from the p-type semiconductor layer 1 readily recombine with the electrons of the buffer layer 2. Thus, the saturation collector current $I_C(sat)$ is reduced due to the provision of the buffer layer 2. As the saturation collector current $I_C(sat)$ is reduced, the device is hardly broken upon short-circuiting of a load. On the other hand, the ON-state resistance is increased due to the provision of the buffer layer 2. Thus, the saturation collector current $I_C(sat)$ and the ON-state resistance are comprehensively optimized by properly adjusting the thickness and the impurity concentration of the buffer layer 2.

When the gate voltage $V_{GE}$ is reduced to zero or a reverse bias (negative value) from the value exceeding the threshold value while applying the collector voltage $V_{CE}$ of the prescribed magnitude, the channel region 6 which has been reversed to the n-type returns to the original p-type. Consequently, the injection of the electrons from the emitter electrode 9 is stopped. Thus, the injection of the holes from the p-type semiconductor layer 1 is also stopped.

Thereafter the electrons and the holes which have been stored in the n-type semiconductor layer 3 (and the buffer layer 2) are collected in the collector electrode 10 and the emitter electrode 9 respectively, or reduced by recombining with each other, to finally disappear. At this time, the holes are reduced at a lower rate than the electrons, whereby a hole current passing into the emitter electrode 9 mainly causes the so-called tail current which appears in the collector current $I_C$. A time required for attenuation of the collector current $I_C$ (generally defined by a time required for attenuating the collector current $I_C$ from 90% of $I_C$ in an ON-state to 10%) is called a fall time $t_f$. The fall time $t_f$ is preferably minimized, as a matter of course.

The buffer layer 2 is also adapted to prevent a depletion layer extending from the p-type base layer 4 from reaching the p-type semiconductor layer 1 and allowing conduction between the p-type semiconductor layer 1 and the p-type base layer 4 (called "punch-through") when the collector voltage $V_{CE}$ is applied to the IGBT 151 up to a value which is close to a breakdown voltage, thereby improving the withstand voltage of the device.

In a general IGBT including the device 151 shown in FIG. 36, a trade-off relation is present between a requirement for reduction of the saturation voltage $V_{CE}(sat)$ and that for reduction of the fall time $t_f$. In recent years, therefore, attempts for compatibly improving both of these requirements have been energetically advanced. Such an improvement has been mainly made by refining a MOS structure which is formed along the upper major surface of the semiconductor body 12 in the IGBT 151, i.e., the structure formed by the n-type semiconductor layer 3, the p-type base layer 4 and the n-type emitter region 5.

The inventor has presented an IGBT having a trench gate shown in a front sectional view of FIG. 37, in a meeting of a scientific society held in 1994. This IGBT 152 is provided with a groove 31 which opens on an upper major surface of a semiconductor body 12 and passes through a p-type base layer 4 and an n-type emitter region 5, to reach an n-type semiconductor layer 3. Further, a gate electrode 33 consisting of polysilicon is buried in the groove 31, through a gate insulating film 32. In this device 152, a region 35 of the p-type base layer 4 which is opposed to the gate electrode 33 serves as a channel region.

In the device 152, refinement of the MOS structure has been remarkably advanced due to the trench gate type of the MOS structure. Consequently, improvement of the saturation voltage $V_{CE}(sat)$ and the fall time $t_f$ has been advanced. Thus, compatible improvement of the saturation voltage $V_{CE}(sat)$ and the fall time $t_f$ in the IGBT has been mainly promoted by improving the MOS structure. However, the improvement of the MOS structure is regarded as reaching the limit by the employment of the trench gate structure.

On the other hand, the inventor has disclosed an IGBT which can compatibly improve the saturation voltage $V_{CE}(sat)$ and SOA (Safe Operation Area) by improving a portion different from the MOS structure as shown in a front sectional view of FIG. 38, in Japanese Patent Laying-Open No. 6-204481 (1994). In this device 153, a high concentration n-type semiconductor region 21 having a high n-type impurity concentration of about $1 \times 10^{18}$ to $1 \times 10^{21}$ cm$^{-3}$ is selectively formed in a buffer layer 2. The n-type impurity concentration of the buffer layer 2 is set at a lower value of about $5 \times 10^{14}$ to $1 \times 10^{17}$ cm$^{-3}$.

In this device 153, it is expected that not only the saturation voltage $V_{CE}(sat)$ and SOA are compatibly improved as compared with a device having the same MOS structure, but the saturation voltage $V_{CE}(sat)$ and the fall time $t_f$ can also be compatibly improved. Namely, it is expected that the device 153 achieves a breakthrough about the limit in improvement of the MOS structure, and prepares a way for further improving the saturation voltage $V_{CE}(sat)$ and the fall time $t_f$. In the device 153, however, the shape of the high concentration n-type semiconductor region 21 is not optimized in view of compatible improvement of the saturation compatible improvement of the saturation voltage $V_{CE}(sat)$ and the fall time $t_f$, and hence latent ability of the device 153 has not been sufficiently brought out.

SUMMARY OF THE INVENTION

According to a first aspect of the present invention, a semiconductor device comprises a semiconductor body having a pair of major surfaces and a pair of main electrodes which are connected to the pair of major surfaces respectively, and the semiconductor body includes a bipolar structure, while the bipolar structure has a first semiconductor layer of first conductivity type, second and third semiconductor layers of second conductivity type, and a fourth semiconductor layer of first conductivity type which are successively stacked from first to second ones of the pair of major surfaces, the concentration of a second conductivity type impurity in the second semiconductor layer is higher than that in the third semiconductor layer, the bipolar structure further comprises a semiconductor region having a shorter carrier lifetime than that in the second semiconductor layer, the second semiconductor region is selectively formed to have a distance D and a width W along the pair of major surfaces to be at least partially overlapped with or to be adjacent to the second semiconductor layer, a relative distance value D/L equal to the distance D divided by a thickness L of the third semiconductor layer and a relative width W/L equal to the width W divided by the thickness L defining a two-dimensional (D/L, W/L) space. In the two-dimensional space the distance D, the width W and the thickness L have respective values that fall within a region bounded by, but not containing, a first linear segment defined by respective coordinates (0, 0.12) and (0.22, 0.44), and bounded by, but not containing, a second segment defined by respective coordinates (0,0) and (0.22, 0), where the coordinates are in the format (D/L, W/L), as will be discussed in reference to FIG. 5.

According to a second aspect to the present invention, the distance D, the width W, and the thickness L have respective values within another region bounded by, but not containing, a third segment having respective coordinates (0, 0.04) and (0.22, 0.42), and bounded by, but not containing a fourth segment having respective coordinates (0,0) and (0.22,0).

According to a third aspect of the present invention, the fourth semiconductor layer is selectively formed in the shape of a strip which is parallel to the second major surface, and the semiconductor region is formed in the shape of a plurality of strips which are arranged in parallel with each other, to two-level-cross with the strip-shaped fourth semiconductor layer.

According to a fourth aspect of the present invention, the fourth semiconductor layer is selectively formed in the shape of a strip which is parallel to the second major surface, and the semiconductor region is formed in the shape of island regions isolated from each other and arranged in a matrix configuration.

According to a fifth aspect of the present invention, the fourth semiconductor layer is selectively formed in the shape of a strip which is parallel to the second major surface, and the semiconductor region is formed in the shape of a cross stripe.

According to a sixth aspect of the present invention, the semiconductor body further comprises a fifth semiconductor layer of second conductivity type which is selectively formed in the fourth semiconductor layer, and the semiconductor device further comprises a gate electrode opposed to a channel region through an insulating film, which is a surface part of the fourth semiconductor layer held between the third and fifth semiconductor layers.

According to a seventh aspect of the present invention, the semiconductor region is a second conductivity type region having a higher impurity concentration than that in the second semiconductor layer.

According to an eighth of the present invention, the semiconductor region is a region into which a crystal defect is introduced by irradiation with particles.

According to a ninth aspect of the present invention, a method of fabricating a semiconductor device, comprising a semiconductor body having a pair of major surfaces and a pair of main electrodes which are connected to the pair of major surfaces respectively so that the semiconductor body includes a bipolar structure, comprises the steps of (a) preparing a semiconductor substrate of first conductivity type having first and second major surfaces, (b) forming a screen selectively having an opening on the first major surface of the semiconductor substrate, (c) selectively introducing an impurity of second conductivity type into the first major surface through the opening, (d) removing the screen after the step (c), (e) regarding the semiconductor substrate as a first semiconductor layer and depositing a second semiconductor layer of second conductivity type on the first major surface by epitaxy after the step (d), (f) depositing a third semiconductor layer of second conductivity type which is lower in impurity concentration than the second semiconductor layer on the second semiconductor layer by epitaxy, and (g) diffusing the impurity introduced in the step (c) simultaneously with the steps (e) and (f), thereby selectively forming a semiconductor region of second conductivity type containing the impurity in a higher concentration than the second semiconductor layer, while the shape of the opening is so decided that the semiconductor region has a distance D and a width W along the pair of major surfaces of the semiconductor body in a finally completed stage of the semiconductor device and a combination (D/L, W/L) of relative values of the distance D and the width W with respect to a thickness L of the third semiconductor layer is at values within a region held between a segment connecting (0, 0.12) with (0.22, 0.44) and a segment connecting (0, 0) with (0, 0.22) while excluding the segments.

According to a tenth aspect of the present invention, a method of fabricating a semiconductor device, comprising a semiconductor body having a pair of major surfaces and a pair of main electrodes which are connected to the pair of major surfaces respectively so that the semiconductor body includes a bipolar structure, comprises the steps of (a) forming a semiconductor substrate having a first semiconductor layer of first conductivity type which is exposed on a first major surface thereof and a second semiconductor layer of second conductivity type which is formed on the first semiconductor layer and exposed on a second major surface thereof, (b) forming a screen selectively having an opening on the second major surface of the semiconductor substrate, (c) selectively introducing an impurity of second conductivity type into the second major surface through the opening, (d) removing the screen after the step (c), (e) depositing a third semiconductor layer of second conductivity type which is lower in impurity concentration than the second semiconductor layer on the second major surface by epitaxy after the step (d), and (f) diffusing the impurity introduced in the step (c) simultaneously with the step (e), thereby selectively forming a semiconductor region of second conductivity type containing the impurity in a higher concentration than the second semiconductor layer, while the shape of the opening is so decided that the semiconductor region has a distance D and a width W along the pair of major surfaces of the semiconductor body in a finally completed stage of the semiconductor device and a combination (D/L, W/L) of relative values of the distance D and the width W with respect to a thickness L of the third semiconductor layer is at values within a region held between a segment connecting (0, 0.12) with (0.22, 0.44) and a segment connecting (0, 0) with (0, 0.22) while excluding the segments.

According to an eleventh aspect of the present invention, a method of fabricating a semiconductor device, comprising a semiconductor body having a pair of major surfaces and a pair of main electrodes which are connected to the pair of major surfaces respectively so that the semiconductor body includes a bipolar structure, comprises the steps of (a) forming a semiconductor substrate having a first semiconductor layer of first conductivity type which is exposed on a first major surface thereof and a second semiconductor layer of first conductivity type which is formed on the first semiconductor layer, exposed on a second major surface thereof, and higher in impurity concentration than the first semiconductor layer, (b) forming a screen selectively having an opening on the second major surface, (c) selectively introducing an impurity of first conductivity type into the second major surface through the opening, (d) removing the screen after the step (c), (e) depositing a third semiconductor layer of second conductivity type on the second major surface by epitaxy after the step (d), and (f) diffusing the impurity introduced in the step (c) simultaneously with the step (e), thereby selectively forming a semiconductor region of first conductivity type containing the impurity in a higher concentration than the second semiconductor layer, while the shape of the opening is so decided that the semiconductor region has a distance D and a width W along the pair of major surfaces of the semiconductor body in a finally completed stage of the semiconductor device and a combination (D/L, W/L) of relative values of the distance D and the width W with respect to a thickness L of the first semiconductor layer is at values within a region held between a segment connecting (0, 0.12) with (0.22, 0.44) and a segment connecting (0, 0) with (0, 0.22) while excluding the segments.

According to a twelfth aspect of the present invention, a method of fabricating a semiconductor device, comprising a semiconductor body having a pair of major surfaces and a pair of main electrodes which are connected to the pair of major surfaces respectively so that the semiconductor body includes a bipolar structure, comprises the steps of (a) preparing a semiconductor substrate of first conductivity type having first and second major surfaces, (b) forming a screen selectively having an opening on the first major surface of the semiconductor substrate, (c) selectively introducing an impurity of second conductivity type into the first major surface through the opening, (d) removing the screen after the step (c), (e) regarding the semiconductor substrate as a first semiconductor layer and depositing a second semiconductor layer of first conductivity type which is higher in impurity concentration than the first semiconductor layer on the first major surface by epitaxy after the step (d), (f) depositing a third semiconductor layer of second conductivity type on the second semiconductor layer by epitaxy, and (g) diffusing the impurity introduced in the step (c) simultaneously with the steps (e) and (f), thereby selectively forming a semiconductor region of a first conductivity type containing the impurity in a higher concentration than the second semiconductor layer, while the shape of the opening is so decided that the semiconductor region has a distance D and a width W along the pair of major surfaces of the semiconductor body in a finally completed stage of the semiconductor device and a combination (D/L, W/L) of relative values of the distance D and the width W with respect to a thickness L of the first semiconductor layer is at values within a region held between a segment connecting (0, 0.12) with (0.22, 0.44) and a segment connecting (0, 0) with (0, 0.22) while excluding the segments.

According to a thirteenth aspect of the present invention, a method of fabricating a semiconductor device, comprising a semiconductor body having a pair of major surfaces and a pair of main electrodes which are connected to the pair of major surfaces respectively so that the semiconductor body includes a bipolar structure, comprises the steps of (a) forming a first semiconductor layer of first conductivity type, a second semiconductor layer of second conductivity type, a third semiconductor layer of second conductivity type which is lower in impurity concentration than the second semiconductor layer, and a fourth semiconductor layer of first conductivity type to be successively stacked from first one toward second one of the pair of major surfaces, (b) preparing a screen selectively having an opening, and (c) selectively applying particles through the opening of the screen, thereby selectively forming a semiconductor region containing a crystal defect to be at least partially overlapped with or to be adjacent to the second semiconductor layer, while the shape of the opening is so decided that the semiconductor region has a distance D and a width W along the pair of major surfaces of the semiconductor body and a combination (D/L, W/L) of relative values of the distance D and the width W with respect to a thickness L of the third semiconductor layer is at values within a region held between a segment connecting (0, 0.12) with (0.22, 0.44) and a segment connecting (0, 0) with (0, 0.22) while excluding the segments.

According to a fourteenth aspect of the present invention, a method of fabricating a semiconductor device, comprising a semiconductor body having a pair of major surfaces and a pair of main electrodes which are connected to the pair of major surfaces respectively so that the semiconductor body includes a bipolar structure, comprises the steps of (a) forming a first semiconductor substrate having a first semiconductor layer of first conductivity type which is exposed on a first major surface thereof and a second semiconductor layer of first conductivity type which is formed on the first semiconductor layer, exposed on a second major surface thereof, and higher in impurity concentration than the first semiconductor layer, (b) forming a screen selectively having an opening on the second major surface, (c) selectively introducing an impurity of first conductivity type into the second major surface through the opening, (d) removing the screen after the step (c), (e) preparing a second semiconductor substrate of second conductivity type having a pair of major surfaces as a third semiconductor layer, (f) bonding the second major surface of the fist semiconductor substrate and one of the pair of major surfaces of the second semiconductor substrate with each other by direct bonding involving a heat treatment after the step (d), and (g) diffusing the impurity introduced in the step (c) simultaneously with the step (f), thereby selectively forming a semiconductor region of first conductivity type containing the impurity in a higher concentration than the second semiconductor layer, while the shape of the opening is so decided that the semiconductor region has a distance D and a width W along the pair of major surfaces of the semiconductor body in a finally completed stage of the semiconductor device and a combination (D/L, W/L) of relative values of the distance D and the width W with respect to a thickness L of the first semiconductor layer is at values within a region held between a segment connecting (0, 0.12) with (0.22, 0.44) and a segment connecting (0, 0) with (0, 0.22) while excluding the segments.

According to a fifteenth aspect of the present invention, a method of fabricating a semiconductor device, comprising a semiconductor body having a pair of major surfaces and a pair of main electrodes which are connected to the pair of major surfaces respectively so that the semiconductor body includes a bipolar structure, comprises the steps of (a) preparing a first semiconductor substrate of first conductivity type having first and second major surfaces, (b) forming a screen selectively having an opening on the first major surface of the first semiconductor substrate, (c) selectively introducing an impurity of second conductivity type into the first major surface through the opening, (d) removing the screen after the step (c), (e) regarding the first semiconductor substrate as a first semiconductor layer and depositing a second semiconductor layer of first conductivity type which is higher in impurity concentration than the first semiconductor layer on the first major surface after the step (d), (f) preparing a second semiconductor substrate of second conductivity type having a pair of major surfaces as a third semiconductor layer, (g) bonding a major surface of the second semiconductor layer which is opposed to the first semiconductor layer with one of the pair of major surfaces of the second semiconductor substrate by direct bonding involving a heat treatment after the step (e), and (h) diffusing the impurity introduced in the step (c) simultaneously with the steps (e) and (g), thereby selectively forming a semiconductor region of first conductivity type containing the impurity in a higher concentration than the second semiconductor layer, while the shape of the opening is so decided that the semiconductor region has a distance D and a width W along the pair of major surfaces of the semiconductor body in a finally completed stage of the semiconductor device and a combination (D/L, W/L) of relative values of the distance D and the width W with respect to a thickness L of the first semiconductor layer is at values within a region held between a segment connecting (0, 0.12) with (0.22, 0.44) and a segment connecting (0, 0) with (0, 0.22) while excluding the segments.

According to a sixteenth aspect of the present invention, a method of fabricating a semiconductor device, comprising a semiconductor body having a pair of major surfaces and a pair of main electrodes which are connected to the pair of major surfaces respectively so that the semiconductor body includes a bipolar structure, comprises the steps of (a) preparing a first semiconductor substrate of first conductivity type having first and second major surfaces, (b) forming a screen selectively having an opening on the first major surface of the first semiconductor substrate, (c) selectively introducing an impurity of second conductivity type into the first major surface through the opening, (d) removing the screen after the step (c), (e) regarding the semiconductor substrate as a first semiconductor layer and depositing a second semiconductor layer of second conductivity type on the first major surface by epitaxy after the step (d), (f) preparing a second semiconductor substrate of second conductivity type which has a pair of major surfaces and is lower in impurity concentration than the second semiconductor layer as a third semiconductor layer, (g) bonding a major surface of the second semiconductor layer which is opposed to the first semiconductor layer with one of the pair of major surfaces of the second semiconductor substrate by direct bonding involving a heat treatment after the step (e), and (h) a step of diffusing the impurity introduced in the step (c) simultaneously with the steps (e) and (g), thereby selectively forming a semiconductor region of second conductivity type containing the impurity in a higher concentration than the second semiconductor layer, while the shape of the opening is so decided that the semiconductor region has a distance D and a width W along the pair of major surfaces of the semiconductor body in a finally completed stage of the semiconductor device and a combination (D/L, W/L) of relative values of the distance D and the width W with respect to a thickness L of the third semiconductor layer is at values within a region held between a segment connecting (0, 0.12) with (0.22, 0.44) and a segment connecting (0, 0) with (0, 0.22) while excluding the segments.

According to a seventeenth aspect of the present invention, a method of fabricating a semiconductor device, comprising a semiconductor body having a pair of major surfaces and a pair of main electrodes which are connected to the pair of major surfaces respectively so that the semiconductor body includes a bipolar structure, comprises the steps of (a) forming a first semiconductor substrate having a first semiconductor layer of first conductivity type which is exposed on a first major surface thereof and a second semiconductor layer of second conductivity type which is formed on the first semiconductor layer and exposed on a second major surface thereof, (b) forming a screen selectively having an opening on the second major surface, (c) selectively introducing an impurity of second conductivity type into the second major surface through the opening, (d) removing the screen after the step (c), (e) preparing a second semiconductor substrate of second conductivity type which has a pair of major surfaces and is lower in impurity concentration than the second semiconductor layer as a third semiconductor layer, (f) bonding the second major surface of the first semiconductor layer with the first one of the pair of major surfaces of the second semiconductor substrate by direct bonding involving a heat treatment after the step (d), and (g) diffusing the impurity introduced in the step (c) simultaneously with the step (f), thereby selectively forming a semiconductor region of second conductivity type containing the impurity in a higher concentration than the second semiconductor layer, while the shape of the opening is so decided that the semiconductor region has a distance D and a width W along the pair of major surfaces of the semiconductor body in a finally completed stage of the semiconductor device and a combination (D/L, W/L) of relative values of the distance D and the width W with respect to a thickness L of the third semiconductor layer is at values within a region held between a segment connecting (0, 0.12) with (0.22, 0.44) and a segment connecting (0, 0) with (0, 0.22) while excluding the segments.

According to an eighteenth aspect of the present invention, a method of fabricating a semiconductor device, comprising a semiconductor body having a pair of major surfaces and a pair of main electrodes which are connected to the pair of major surfaces respectively so that the semiconductor body includes a bipolar structure, comprises the steps of (a) preparing a first semiconductor substrate of first conductivity type having first and second major surfaces as a first semiconductor layer, (b) forming a screen selectively having an opening on the first major surface of the first semiconductor substrate, (c) selectively introducing an impurity of second conductivity type into the first major surface through the opening, (d) removing the screen after the step (c), (e) forming a second semiconductor substrate having a second semiconductor layer of second conductivity type which is exposed on a first major surface thereof and a third semiconductor layer of second conductivity type which is formed on the second semiconductor layer, exposed on a second major surface thereof, and higher in impurity concentration than the second semiconductor layer, (f) bonding the second major surface of the second semiconductor substrate with the first major surface of the first semiconductor substrate by direct bonding involving a heat treatment after the step (d), and (g) diffusing the impurity introduced in the step (c) simultaneously with the step (f), thereby selectively forming a semiconductor region of second conductivity type containing the impurity in a higher concentration than the third semiconductor layer, while the shape of the opening is so decided that the semiconductor region has a distance D and a width W along the pair of major surfaces of the semiconductor body in a finally completed stage of the semiconductor device and a combination (D/L, W/L) of relative values of the distance D and the width W with respect to a thickness L of the second semiconductor layer is at values within a region held between a segment connecting (0, 0.12) with (0.22, 0.44) and a segment connecting (0, 0) with (0, 0.22) while excluding the segments.

According to a nineteenth aspect of the present invention, the shape of the opening is so decided as to be at a value within a region held between a segment connecting (0, 0.04) with (0.22, 0.42) and a segment connecting (0, 0) with (0.22, 0.22) in a finally completed stage of the semiconductor device.

In the device according to the first aspect of the present invention, the semiconductor region having a short lifetime is selectively formed to be overlapped with or adjacent to the second semiconductor layer. Therefore, two types of paths including a path in which the semiconductor region having a short lifetime is interposed and that in which only the second semiconductor layer is interposed with no interposition of the semiconductor region having a short lifetime are present in a parallel manner in the paths of carriers flowing across the first and third semiconductor layers. Further, a condition based on a simulation and an experiment is added to the shape of the semiconductor region, i.e., the sectional shape of each of the two types of paths, whereby the saturation voltage $V_{CE}$(sat) and the fall time $t_f$ are compatibly improved as compared with the prior art having no semiconductor region.

In the device according to the second aspect of the present invention, an optimum condition based on a simulation is added to the shape of the semiconductor region, whereby compatible improvement of the saturation voltage $V_{CE}$(sat) and the fall time $t_f$ is achieved to the best degree. Further, no significant influences appear in the saturation voltage $V_{CE}$(sat) and the fall time $t_f$ even if an error on the fabrication step is caused in the shape of the semiconductor region. As a result, the characteristics of the device serving as a product are stabilized.

In the device according to the third aspect of the present invention, the fourth semiconductor layer is formed in the shape of a strip which is parallel to the major surfaces of the semiconductor body, whereby the same is suitable for a device having a number of unit cells which are arranged in parallel with each other. Further, the fourth semiconductor layer and the strip-shaped semiconductor region are formed to two-level cross with each other, whereby no alignment is required between mask patterns which are employed for forming the fourth semiconductor layer and the semiconductor region respectively. Thus, the fabrication steps are simplified.

In the device according to the fourth aspect of the present invention, the fourth semiconductor layer is formed in the shape of a strip which is parallel to the major surfaces of the semiconductor body, whereby the same is suitable for a device having a number of unit cells which are arranged in parallel with each other. Further, the semiconductor region is formed in the shape of island regions isolated from each other and arranged in a matrix configuration, whereby no alignment is required between mask patterns which are employed for forming the fourth semiconductor layer and the semiconductor region respectively. Thus, the fabrication steps are simplified.

In the device according to the fifth aspect of the present invention, the fourth semiconductor layer is formed in the shape of a strip which is parallel to the major surfaces of the semiconductor body, whereby the same is suitable for a device having a number of unit cells which are arranged in parallel with each other. Further, the semiconductor region is formed in the shape of a cross stripe, whereby no alignment is required between mask patterns which are employed for forming the fourth semiconductor layer and the semiconductor region respectively. Thus, the fabrication steps are simplified.

The device according to the sixth aspect of the present invention comprises the MOS structure having a channel region defined by a surface part of the fourth semiconductor layer, whereby the saturation voltage $V_{CE}(sat)$ and the fall time $t_f$ can be compatibly improved in a semiconductor device having both of a bipolar structure and a MOS structure such as an IGBT or an MCT, for example.

In the device according to the seventh aspect of the present invention, the semiconductor region is a second conductivity type region having a higher impurity concentration than that in the second semiconductor layer, whereby its lifetime is shorter than that in the second semiconductor layer. Thus, a semiconductor region having a short lifetime can be formed by a simple step of introducing the impurity in a high concentration. Namely, the fabrication steps are effectively simplified.

In the device according to the eighth aspect of the present invention, the semiconductor region is a region into which a crystal defect is introduced by application of particles, whereby recombination of carriers is facilitated and the lifetime is reduced. The semiconductor region can be formed through a simple step of applying particles, whereby the fabrication steps are effectively simplified.

In the fabrication method according to the ninth aspect of the present invention, the screen is formed on a major surface of the first semiconductor layer, and the impurity is selectively introduced into a prescribed region through the screen. Diffusion of the impurity simultaneously progresses during the subsequent process of deposition of the second and third semiconductor layers, whereby the semiconductor region having a higher impurity concentration than the second semiconductor layer is selectively formed to be overlapped with or adjacent to the second semiconductor layer. The shape of the opening provided in the screen is so adjusted that the semiconductor region is formed in a shape along a prescribed condition. Therefore, it is possible to readily fabricate a device compatibly improving the saturation voltage $V_{CE}(sat)$ and the fall time $t_f$ as compared with the prior art.

The fabrication method according to the tenth aspect of the present invention is adapted to carry out the fabrication method according to the ninth aspect while replacing the order of the steps of depositing the second semiconductor layer and introducing the impurity, and is readily executable similarly to the method according to the ninth aspect.

The fabrication method according to the eleventh aspect of the present invention is adapted to carry out the fabrication method according to the tenth aspect while replacing the order of formation of the first semiconductor layer and that of the third semiconductor layer, and is readily executable similarly to the method according to the tenth aspect.

The fabrication method according to the twelfth aspect of the present invention is adapted to carry out the fabrication method according to the ninth aspect while replacing the order of formation of the first semiconductor layer and that of the third semiconductor layer, and is readily executable similarly to the method according to the ninth aspect.

In the fabrication method according to the thirteenth aspect of the present invention, particles are applied through the screen selectively having the opening after forming the bipolar structure having the first to fourth semiconductor layers for introducing a crystal defect, thereby selectively forming the semiconductor region having a shorter lifetime than the second semiconductor layer to be overlapped with or adjacent to the second semiconductor layer. Further, the shape of the opening provided in the screen is so adjusted as to form the semiconductor region in a shape coinciding with a prescribed condition. Therefore, it is possible to readily fabricate a device compatibly improving the saturation voltage $V_{CE}(sat)$ and the fall time $t_f$ as compared with the prior art.

The fabrication according to the fourteenth aspect of the present invention is adapted to directly bond a separately prepared semiconductor substrate corresponding to the third semiconductor layer onto the second semiconductor layer in place of forming the third semiconductor layer by epitaxy in the fabrication method according to the eleventh aspect, and is readily executable similarly to the method according to the eleventh aspect.

The fabrication method according to the fifteenth aspect of the present invention is adapted to directly bond a separately prepared semiconductor substrate corresponding to the third semiconductor layer onto the second semiconductor layer in place of forming the third semiconductor layer by epitaxy in the fabrication method according to the twelfth aspect, and is readily executable similarly to the method according to the twelfth aspect.

The fabrication method according to the sixteenth aspect of the present invention is adapted to directly bond a separately prepared semiconductor substrate corresponding to the third semiconductor layer onto the second semiconductor layer in place of forming the third semiconductor layer by epitaxy in the fabrication method according to the ninth aspect, and is readily executable similarly to the method according to the ninth aspect.

The fabrication method according to the seventeenth aspect of the present invention is adapted to directly bond a separately prepared semiconductor substrate corresponding to the third semiconductor layer onto the second semiconductor layer in place of forming the third semiconductor layer by epitaxy in the fabrication method according to the tenth aspect, and is readily executable similarly to the method according to the tenth aspect.

The fabrication method according to the eighteenth aspect of the present invention is adapted to directly bond a semiconductor substrate formed by stacking second and third semiconductor layers onto the first semiconductor layer in place of successively forming the second and third semiconductor layers by epitaxy in the fabrication method according to the ninth aspect, and is readily executable similarly to the method according to the ninth aspect.

In the fabrication method according to the nineteenth aspect of the present invention, the shape of the opening of the screen is so decided that the semiconductor region is shaped under an optimum condition based on a simulation, whereby it is possible to readily fabricate a device compatibly improving the saturation voltage $V_{CE}$(sat) and the fall time $t_f$ as compared with the prior art.

An object of the present invention is to provide a semiconductor device having a buffer layer in a bipolar structure, which compatibly improves a saturation voltage and a fall time.

Another object of the present invention is to provide a method which is suitable for fabricating the aforementioned semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

1. Embodiment 1

First, a semiconductor device according to an embodiment 1 is described.

<1-1. Basic Structure of Device>

Figure 1:
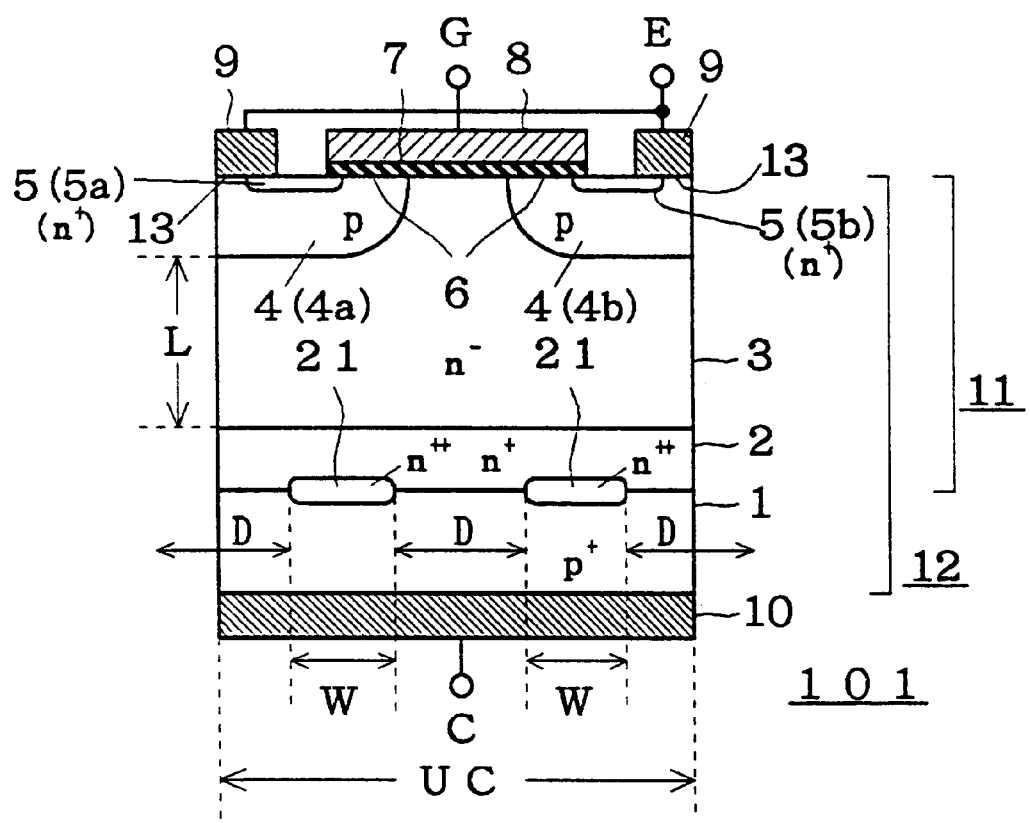
FIG. 1 is a front sectional view showing a device according to an embodiment 1.
Figure 36:
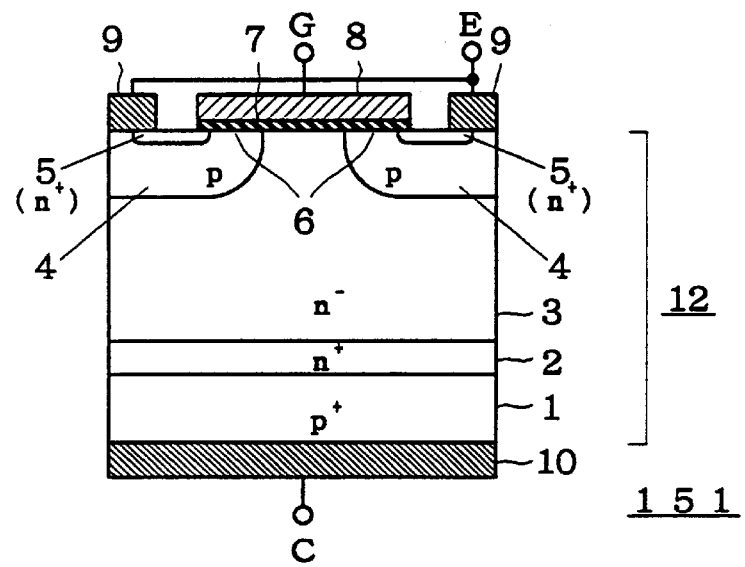
FIG. 36 is a front sectional view showing a conventional device.
Figure 37:
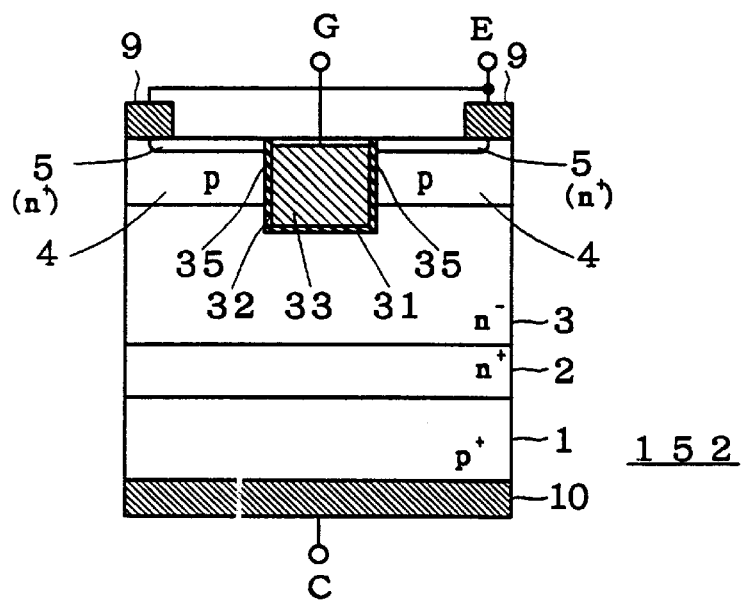
FIG. 37 is a front sectional view showing another conventional device.
Figure 38:
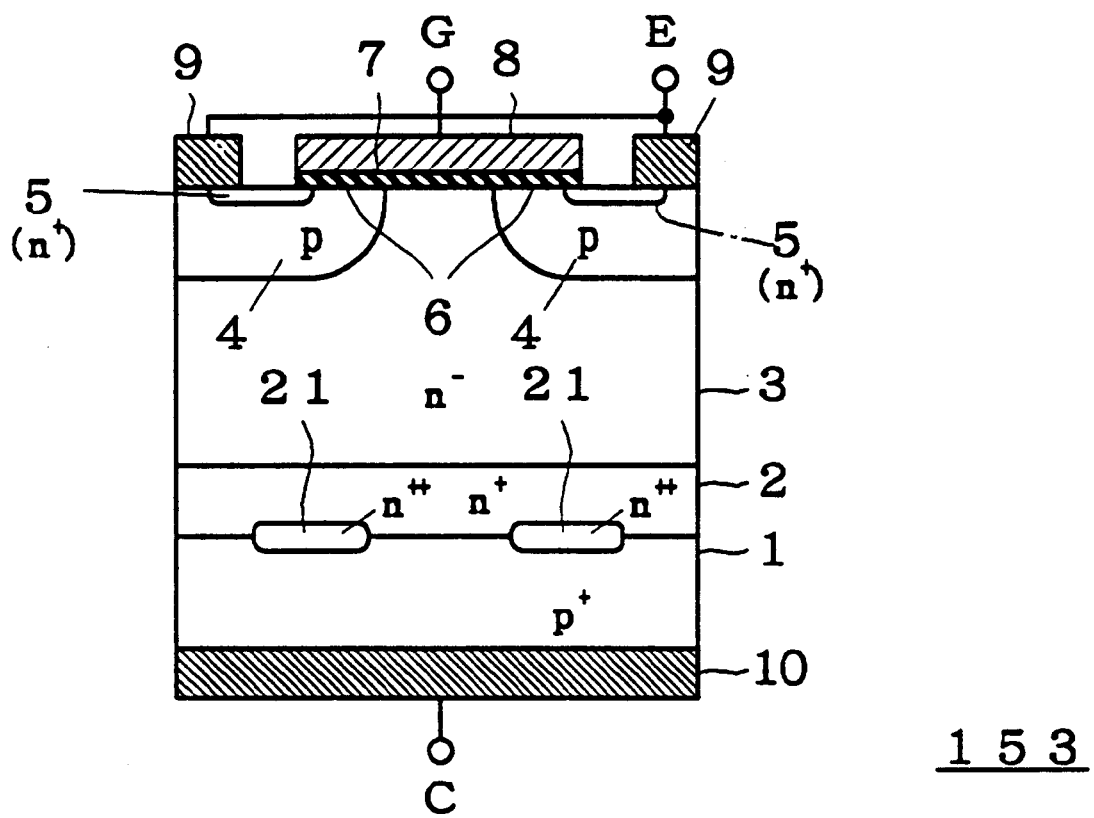
FIG. 38 is a front sectional view showing still another conventional device.

FIG. 1 is a front sectional view showing the structure of the semiconductor device according to this embodiment. This structure 101, which is an n-channel IGBT, is identical in basic structure to the conventional IGBT 153 shown in FIG. 38. The device 101 has such a structure that a number of unit cells UC are connected in parallel with each other, and FIG. 1 draws a single unit cell UC. In the following figures, parts identical or corresponding to those of the conventional devices shown in FIGS. 36 to 38 are denoted by the same reference numerals.

In the IGBT 101, a p-type semiconductor layer 1 is exposed on a lower major surface of a silicon semiconductor body 12 having an upper major surface and the lower major surface, and an n-type semiconductor layer 11 is stacked on an upper major surface of the p-type semiconductor layer 1. This n-type semiconductor layer 11 has a buffer layer 2 which is in contact with the p-type semiconductor layer 1, and an n-type semiconductor layer 3 which is formed on the buffer layer 2 and exposed on the upper major surface of the semiconductor body 12. When the rated voltage is 600 V, the n-type semiconductor layer 3 has an n-type impurity concentration of about $2\times10^{14}$ cm$^{-3}$, while the buffer layer 2 is set at an impurity concentration of about $5\times10^{14}$ to $1\times10^{17}$ cm$^{-3}$, which is higher than that in the n-type semiconductor layer 3.

Further, a p-type base layer 4 is selectively formed on an upper major surface part of the n-type semiconductor layer 3. This p-type base layer 4 is formed in the shape of a strip extending perpendicularly to the plane of FIG. 1, by selectively diffusing a p-type impurity into the upper major surface of the n-type semiconductor layer 11. A bipolar structure is formed by the p-type semiconductor layer 1, the n-type semiconductor layer 11 and the p-type base layer 4 which are stacked in triple layers.

Defining the range of a single unit cell UC as shown in FIG. 1, the p-type base layer 4 appears as if the same is separated into first and second portions 4a and 4b. However, these first and second portions 4a and 4b are connected to second and first portions 4b and 4a of adjacent unit cells UC respectively, for forming single p-type base layer 4 respectively.

Further, an n-type emitter region 5 is selectively formed on an upper major surface part of the p-type base layer 4. This n-type emitter region 5 is formed by selectively diffusing an n-type impurity inside the upper major surface of the p-type base layer 4. As shown in FIG. 1, the n-type emitter region 5 has first and second portions 5a and 5b. Namely, the n-type emitter region 5 is divided into two strip-shaped regions extending perpendicularly to the plane of FIG. 1, to hold a central region 13 of the upper major surface of the p-type base layer 4.

On the upper major surface of the semiconductor body 12, the n-type semiconductor layer 3 is separated from the first and second portions 5a and 5b by strip-shaped exposed surface portions of the p-type base layer 4 extending perpendicularly to the plane of FIG. 1. The strip-shaped upper major surface portions of the p-type base layer 4 define a channel region 6. Namely, the channel region 6, the first portion 4a, the central region 13, the second portion 4b and the channel region 6 are exposed on the upper major surface of the p-type base layer 4 in this order in the form of strips respectively.

A gate electrode 8 is provided on the channel region 6, to be opposed thereto through a gate insulating film 7. This gate electrode 8 consists of polycrystalline silicon (hereinafter referred to as polysilicon), for example.

On the upper major surface of the semiconductor body 12, an emitter electrode 9 which is a first main electrode is further formed to be electrically connected to both of the central region 13 of the p-type base layer 4 and the n-type emitter region 5. The emitter electrode 9 consists of aluminum, for example, and is electrically insulated from the gate electrode 8. Such emitter electrodes 9 are electrically connected with each other among all unit cells UC, while such gate electrodes 8 are also connected with each other among all unit cells UC.

A collector electrode 10 which is a second main electrode is electrically connected to the lower surface of the semiconductor body 12, i.e., that of the p-type semiconductor layer 1. The collector electrode 10 consists of a metal such as aluminum, for example, and is integrally formed through all unit cells.

In the device 101, further, a high concentration n-type semiconductor region 21 having an n-type impurity concentration of about $1 \times 10^{18}$ to $1 \times 10^{21}$ cm$^{-3}$, which is higher than that in the buffer layer 2, is selectively formed over the boundary (junction plane) between the buffer layer 2 and the p-type semiconductor layer 1. This high concentration n-type semiconductor region 21 is formed in the shape of a strip extending perpendicularly to the plane of FIG. 1. Due to the formation of the high concentration n-type semiconductor region 21, the n-type impurity concentration in the buffer layer 2 can be set in a wider range than that in the conventional device 151 shown in FIG. 36, at about $5 \times 10^{14}$ to $1 \times 10^{17}$ cm$^{-3}$, as described above.

<1-2. Operation of Device>

A basic operation of the device 101 is similar to that of the conventional device 151. Namely, when a gate voltage $V_{GE}$ exceeding a threshold value which is specific to the device is applied across the gate electrode 8 and the emitter electrode 9 while applying a prescribed collector voltage $V_{CE}$ across the emitter electrode 8 and the collector electrode 10, the device shifts to an ON state, and a collector current $I_C$ flows from the collector electrode 10 to the emitter electrode 9. When the gate voltage $V_{GE}$ is reduced from the value exceeding the threshold value to zero or a reverse bias (a negative value) while applying the collector voltage $V_{CE}$ of a prescribed value, on the other hand, the device shifts to an OFF state, and the collector current $I_C$ is attenuated to zero.

A characteristic operation in an ON state of the device 101 is now described. The gate voltage $V_{GE}$ exceeding the threshold value is applied across the gate electrode 8 and the emitter electrode 9 while applying the prescribed collector voltage $V_{CE}$ across the emitter electrode 9 and the collector electrode 10, whereby an n-type channel is formed in the channel region 6, similarly to the conventional device 151. Consequently, electrons are injected from the emitter electrode 9 into the n-type semiconductor layer 3, whereby the p-type semiconductor layer 1 and the n-type semiconductor layer 3 are forward-biased and holes are injected into the n-type semiconductor layer 3 from the p-type semiconductor layer 1.

In the device 101, the buffer layer 2 having a relatively high n-type impurity concentration and the n-type semiconductor region 21 having a higher concentration are arranged in parallel with each other in a path for passing the holes from the p-type semiconductor layer 1 into the n-type semiconductor layer 3. In other words, the path for the holes is in a structure as if a path including no high concentration n-type semiconductor region 21 for readily injecting the holes into the n-type semiconductor layer 3 and a path including the high-concentration n-type semiconductor region 21 for hardly injecting the holes are arranged in parallel with each other.

When the collector current $I_C$ is small, i.e., when the density of the holes directed from the p-type semiconductor layer 1 toward the n-type semiconductor layer 3 is small, the holes are selectively injected through the readily injecting path. On the other hand, the ON-state resistance or a saturation voltage $V_{CE}(\text{sat})$ of the device is defined by a resistance value or the collector voltage $V_{CE}$ corresponding to the rated value of the collector current $I_C$, i.e., the rated current, as described above. The magnitude of the rated current is set in a range where the collector current $I_C$ is small. Therefore, the ON-state resistance or the saturation voltage $V_{CE}(\text{sat})$ of the device 101 is reduced as compared with the case provided with no high concentration n-type semiconductor region 21.

When the collector current $I_C$ is high, on the other hand, the fact that the path for passing the collector current $I_C$ is limited to the portion provided with no high concentration n-type semiconductor region 21 dominantly influences to suppress the collector current $I_C$. Namely, the collector current $I_C$ is lower as compared with the case provided with no high concentration n-type semiconductor region 21 when the collector current $I_C$ is high. Therefore, a saturation collector current $I_C(\text{sat})$ is reduced, whereby short-circuit withstand capability is improved. In the device 101, therefore, the saturation voltage $V_{CE}(\text{sat})$ and SOA are compatibly improved due to the selective formation of the high concentration n-type semiconductor region 21.

A characteristic operation of the device 101 which shifts from an ON state to an OFF state, i.e., which is turned off, is now described. When the gate voltage $V_{GE}$ is reduced from the value exceeding the threshold value to zero or a reverse bias (a negative value) while applying the collector voltage $V_{CE}$ of the prescribed value, the channel region 6 which has been reversed to an n-type returns to its original p-type. Consequently, the injection of the electrons from the emitter electrode 9 is stopped. Subsequently, the injection of the holes from the p-type semiconductor layer 1 is stopped, and a depletion layer extends from the p-type base layer 4 to a deep part of the n-type semiconductor layer 3.

Due to the action of the depletion layer, the electrons and the holes which have been stored in the n-type semiconductor layer 3 are passed to the collector electrode 10 and the emitter electrode 9 respectively. On the other hand, the electrons and the holes which have been stored in the buffer layer 2 remain over a some period after disappearance of the carriers of the n-type semiconductor layer 3, since the depletion layer will not enter the buffer layer 2.

However, the lives of the holes which are minority carriers are short in the high concentration n-type semiconductor region 21, and hence the holes injected from the p-type semiconductor layer 1 are hardly present in the high concentration n-type semiconductor region 21. In the device 101 having the high concentration n-type semiconductor region 21, therefore, attenuation of a tail current at a turn-off time is quickened as compared with the conventional device 151 provided with no high concentration n-type semiconductor region 21. In the device 101, therefore, it is expected that the fall time $t_f$ is reduced as compared with the conventional device 151.

<1-3. Optimization of Shape of High Concentration n-Type Semiconductor Region 21>

Necessary and optimum conditions as to the shape of the high concentration n-type semiconductor region 21 for compatibly improving the saturation voltage $V_{CE}$(sat) and the fall time $t_f$ are now described. Namely, necessary or optimum relations between the width W and the distance D of the high concentration n-type semiconductor region 21 and the thickness L of the n-type semiconductor layer (the distance from the boundary between the n-type semiconductor layer 3 and the buffer layer 2 to the boundary between the n-type semiconductor layer 3 and the p-type base layer 4) shown in FIG. 1 are now considered.

Figure 2:
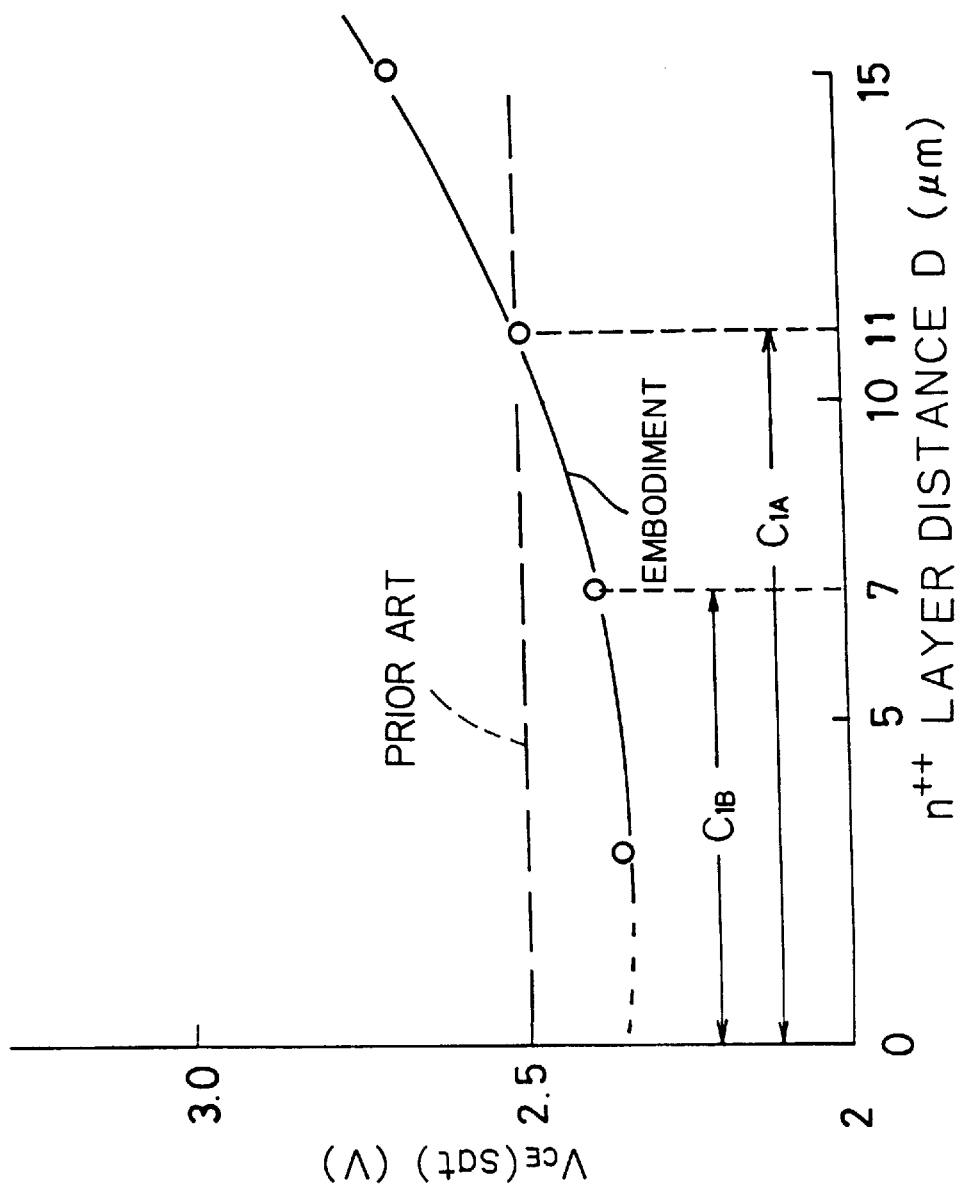
FIG. 2 is a graph showing results of a simulation.

FIG. 2 is a graph showing a result of a simulation executed on an IGBT in which the width W and the distance D are varied while setting the thickness L at a constant value and maintaining the ratio of the width W to the distance D at twice (W/D=2). FIG. 2 also shows a simulation result on the conventional device 151 provided with no high concentration n-type semiconductor region 21, for the purpose of comparison.

In order to comprehensively evaluate the saturation voltage $V_{CE}$(sat) and the fall time $t_f$ which are in a trade-off relation to each other, the fall time $t_f$ is fixed at a constant value of 100 nsec. throughout all simulation objects including the conventional device. Therefore, the quality of compatible improvement of the saturation voltage $V_{CE}$(sat) and the fall time $t_f$ can be evaluated by comparing the saturation voltage $V_{CE}$(sat). The fall time $t_f$ is adjusted by adjusting the impurity concentration of the buffer layer 2 etc. The rated voltage is set at 600 V throughout all object IGBTs.

The graph of FIG. 2 shows the relations between the distances D and the saturation voltages $V_{CE}$(sat) obtained by the simulation executed under the aforementioned conditions. It is understood from this graph that the saturation voltage $V_{CE}$(sat) is increased as the distance D of the high concentration n-type semiconductor region 21 is increased. It is also understood that the saturation voltage $V_{CE}$(sat) is equivalent to that of the conventional device when the distance D is 11 μm and the saturation voltage $V_{CE}$(sat) is inferior to that of the conventional device when the distance D is at a larger value, while the former is improved as compared with the conventional device when the latter is at a smaller value.

Thus, it can be concluded that the necessary range of the distance D for compatibly improving the saturation voltage $V_{CE}$(sat) and the fall time $t_f$ under such a condition that the width W is fixed at twice the distance D is the range of less than 11 μm (the range denoted by symbol $C_{1A}$ in FIG. 2). Particularly when the distance D is in the range of not more than 7 μm (the range denoted by symbol $C_{1B}$ in FIG. 2), the saturation voltage $V_{CE}$(sat) is substantially equal to the minimum value, while change hardly appears in the saturation voltage $V_{CE}$(sat) even if the distance D is changed. Namely, the best characteristics are attained in the range of the distance D of not more than 7 μm. Even if the distance D includes an error on the fabrication step, further, stable characteristics can be attained with no influence of the error appearing on the product. Thus, it can be concluded that the distance D is particularly preferably set in the range of not more than 7 μm under the condition that the width W is fixed at twice the distance D.

Figure 3:
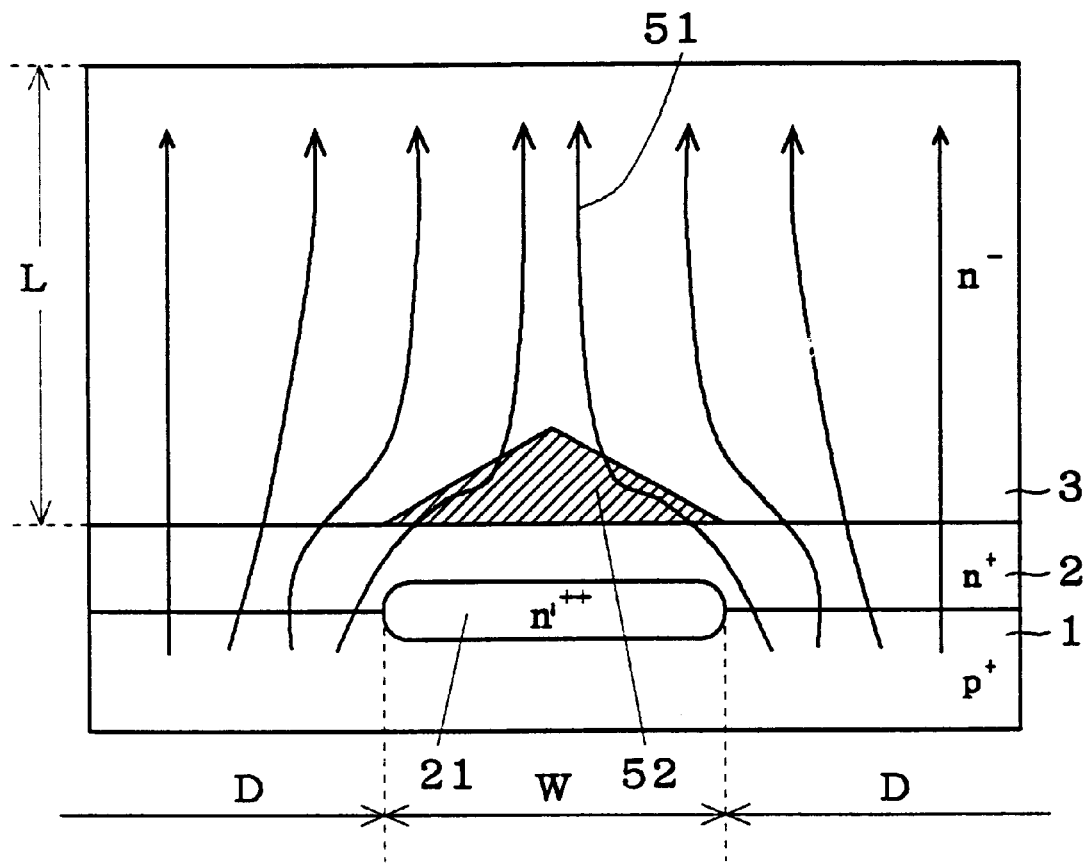
FIG. 3 is a graph illustrating a result of a simulation.

FIG. 3 is a sectional view for illustrating the cause for an influence exerted from the distance D on the saturation voltage $V_{CE}$(sat). The high concentration n-type semiconductor region 21 inhibits injection of holes from the p-type semiconductor layer 1 into the n-type semiconductor layer 3, and hence no hole current flows in a region 52 having a triangular section shown in a hatched manner in FIG. 3, i.e., a region shaded by the high concentration n-type semiconductor region 21 as viewed from the p-type semiconductor layer 1.

In the simulation whose result is shown in FIG. 2, the distance D is varied while maintaining the width W and the distance D at a constant ratio. When the distance D is increased, therefore, the width W is also increased. The region 52 shown in FIG. 3 is enlarged as the width W is increased, whereby a region fed with a current is reduced in the n-type semiconductor layer 3. When the region fed with the current is reduced in the n-type semiconductor layer 3, the saturation voltage $V_{CE}$(sat) is increased. This is the reason why the saturation voltage $V_{CE}$(sat) is increased with the distance D.

When the region 52 remains at a constant magnitude, the influence of the region 52 is reduced as the thickness L of the n-type semiconductor layer 3 is increased. The significance of the influence by the region 52 is substantially decided by the ratios of the thickness L to the width W and that of the thickness L to the distance D. In the IGBT subjected to the simulation, the thickness L was 50 μm. Therefore, it can be concluded that the necessary range of the distance D is less than 11/50 of the thickness L and the optimum range is not more than 7/50 when the width W is fixed at twice the distance D.

Results of a simulation executed under other conditions are now described. The results are shown in a graph of FIG. 4. In this simulation, saturation voltages $V_{CE}$(sat) are calculated while fixing the distance D of the high concentration n-type semiconductor region 21 at 3 μm and varying the width W. The remaining conditions are identical to those of the simulation whose results are shown in FIG. 2.

Figure 4:
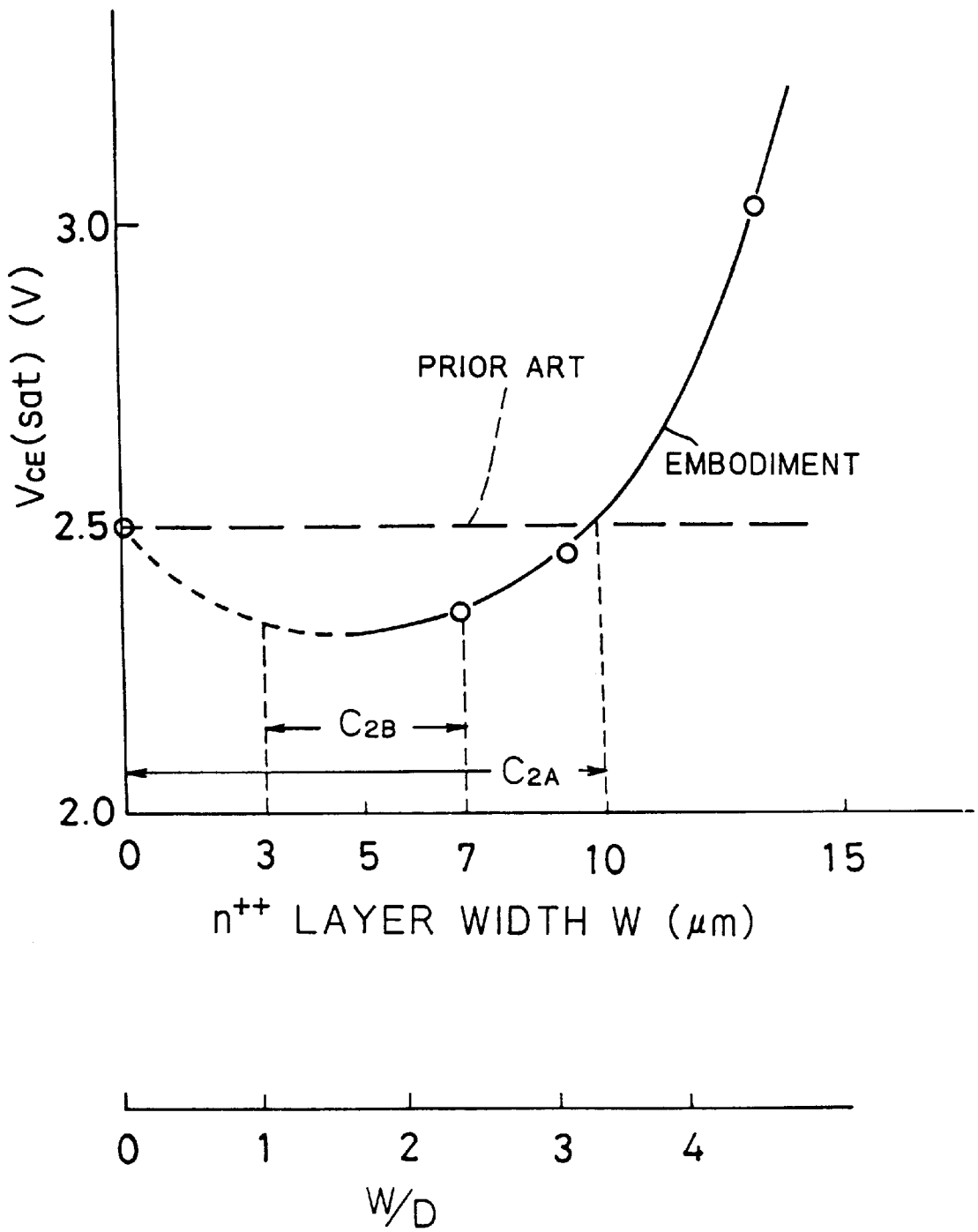
FIG. 4 is a graph showing results of a simulation.

As shown in the graph of FIG. 4, the value of the saturation voltage $V_{CE}$(sat) is identical to that of the conventional device when the width W is zero, as a matter of course. The saturation voltage $V_{CE}(\text{sat})$ is temporarily reduced as the width W is increased from zero, and minimized when the width W is substantially equal to 5 μm. The saturation voltage $V_{CE}(\text{sat})$ is converted from reduction to increase as the width W is increased beyond the minimum point. When the width W is equal to 10 μm, the saturation voltage $V_{CE}(\text{sat})$ is identical to that of the conventional device again.

Namely, the saturation voltage $V_{CE}(\text{sat})$ is higher than that of the conventional device in the region where the width W is larger than 10 μm, while the former is smaller than the latter in the region where the width W is larger than zero and smaller than 10 μm. Therefore, it can be concluded that the necessary range of the width W for compatibly improving the saturation voltage $V_{CE}(\text{sat})$ and the fall time $t_f$ under the condition that the distance D is fixed at the value of 3 μm is the range of larger than 0 μm and less than 10 μm (the range denoted by symbol $C_{2A}$ in FIG. 4).

Particularly in the range of the width W of 3 μm to 7 μm (the range denoted by symbol $C_{2B}$ in FIG. 4), the saturation voltage $V_{CE}(\text{sat})$ is substantially equal to the minimum value, and substantially no change appears in the saturation voltage $V_{CE}(\text{sat})$ even if the width W is changed. Namely, the best characteristics are attained when the width W is within the range $C_{2B}$, while stable characteristics can be attained even if the width W includes an error on the fabrication steps, with no influence of the error appearing in the product. Thus, it can be concluded that the width W is particularly preferably set in the range of 3 μm to 7 μm under the condition that the distance D is fixed at 3 μm.

The aforementioned condition related to the width W of the n-type semiconductor layer 3 can be more generally expressed through relative values with respect to the thickness L of the n-type semiconductor layer 3. Namely, it can be concluded from the simulation results of FIG. 4 that the necessary range of the width W under the condition that the distance D is fixed at 3 μm is the range of less than ⅕ (=10/50) of the thickness L and larger than zero, and the optimum range is the range of 3/50 to 7/50.

Figure 5:
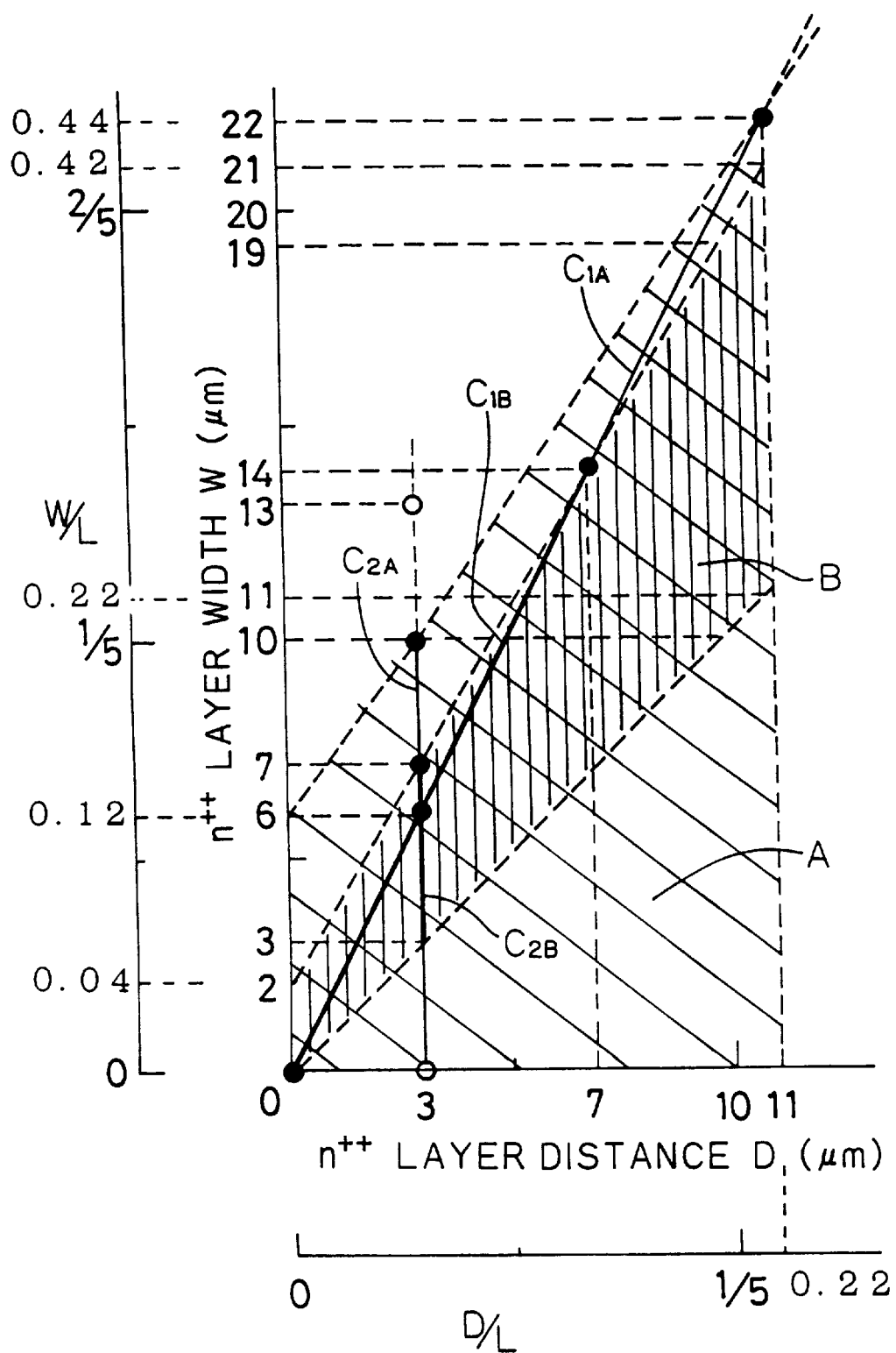
FIG. 5 is a graph showing the results of the simulation in a regularized manner.

FIG. 5 is a graph showing the results of the two simulations including first and second simulations whose results are shown in FIGS. 2 and 4 respectively in a regularized manner. In the graph shown in FIG. 5, the axis of ordinates shows the width W or the ratio W/L, and the axis of abscissas shows the distance D or the ratio D/L. White and black circles show simulation points, and particularly the black circles show points where characteristics superior to those of the conventional device are attained.

In the first simulation, the distance D and the width W are changed along a straight line passing through the origin in FIG. 5 and a point of (D, W)=(11, 22), and a segment (illustrated in a thin solid line) connecting the origin with the point (11, 22) corresponds to the range $C_{1A}$ corresponding to the necessary condition. Further, the range $C_{1B}$ corresponding to the optimum condition corresponds to a segment (illustrated in a thick solid line) connecting the origin with a point (7, 14).

In the second simulation, on the other hand, the width W is changed along a straight line passing through a point of (D, W)=(3, 0) in FIG. 5 which is parallel to the axis of ordinates, and a segment (illustrated in a thin solid line) connecting the point (3, 0) with a point (3, 10) corresponds to the range $C_{2A}$ corresponding to the necessary condition. Further, the range $C_{2B}$ corresponding to the optimum condition corresponds to a segment (illustrated in a thick solid line) connecting a point (3, 3) with a point (3, 7).

Therefore, it can be concluded that a region A which is below the straight line passing through the points (3, 10) and (11, 22) having the distance D of not more than 11 is the range required for the width W and the distance D for compatibly improving the saturation voltage $V_{CE}(\text{sat})$ and the fall time $t_f$. This region A can also be expressed as a region immediately under a segment connecting a point (0, 6) with the point (11, 22). A point on the axis of abscissas coinciding with the conventional device, i.e., the range of the width W=0 is excluded from this region A. In other words, the region A can be expressed as a region which is held between the segment connecting the point (0, 6) with the point (11, 22) and the segment connecting the origin (0, 0) with the point (11, 0) while excluding these segments.

Further, it can be concluded that a region B which is held between a straight line passing through the origin (0, 0) and the point (3, 3) and a straight line passing through the points (3, 7) and (7, 14) with the distance D of not more than 11 is the optimum range for the width W and the distance D. This region B can also be expressed as a region held between a segment connecting a point (0, 2) with the point (11, 21) and a segment connecting the origin (0, 0) with a point (11, 11).

Further, the regions A and B can be generalized as the ranges of the width W and the distance D which are relative to the thickness L of the n-type semiconductor layer 3 respectively. Namely, the region A can be generally expressed as a region which is held between a segment in the range of (D/L, W/L)=(0, 0.12) to (0.22, 0.44) and a segment in the range of (0, 0) to (0.22, 0) while excluding these segments, as shown in FIG. 5. Similarly, the region B can be generally expressed as a region which is held between a segment in the range of (D/L, W/L)=(0, 0.04) to (0.22, 0.42) and a segment in the range of (0, 0) to (0.22, 0.22) while excluding these segments.

<1-4. Verification Test>

A verification test for the aforementioned conditions is now described. A device manufactured by way of trial for verification was in the same structure as the device subjected to the simulation, while the width W of the high concentration n-type semiconductor region 21 of this device was set at 2.5 μm and the distance D was set at 5 μm. These values are included in the region A in FIG. 5. For the purpose of comparison, a sample of the conventional device 151 having no high concentration n-type semiconductor region 21 was also manufactured by way of trial. These devices had rated voltages of 600 V, and rated currents of 100 A.

Figure 6:
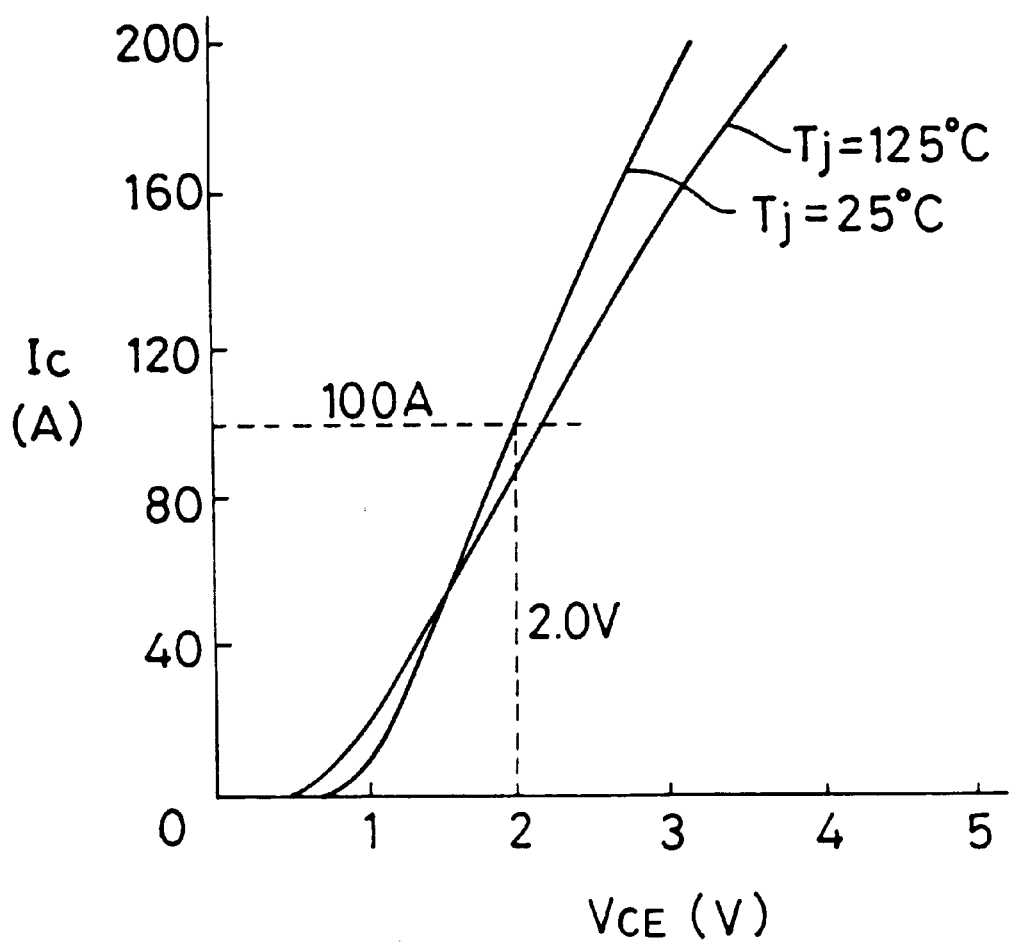
FIG. 6 is a graph showing results of a verification test.
Figure 7:
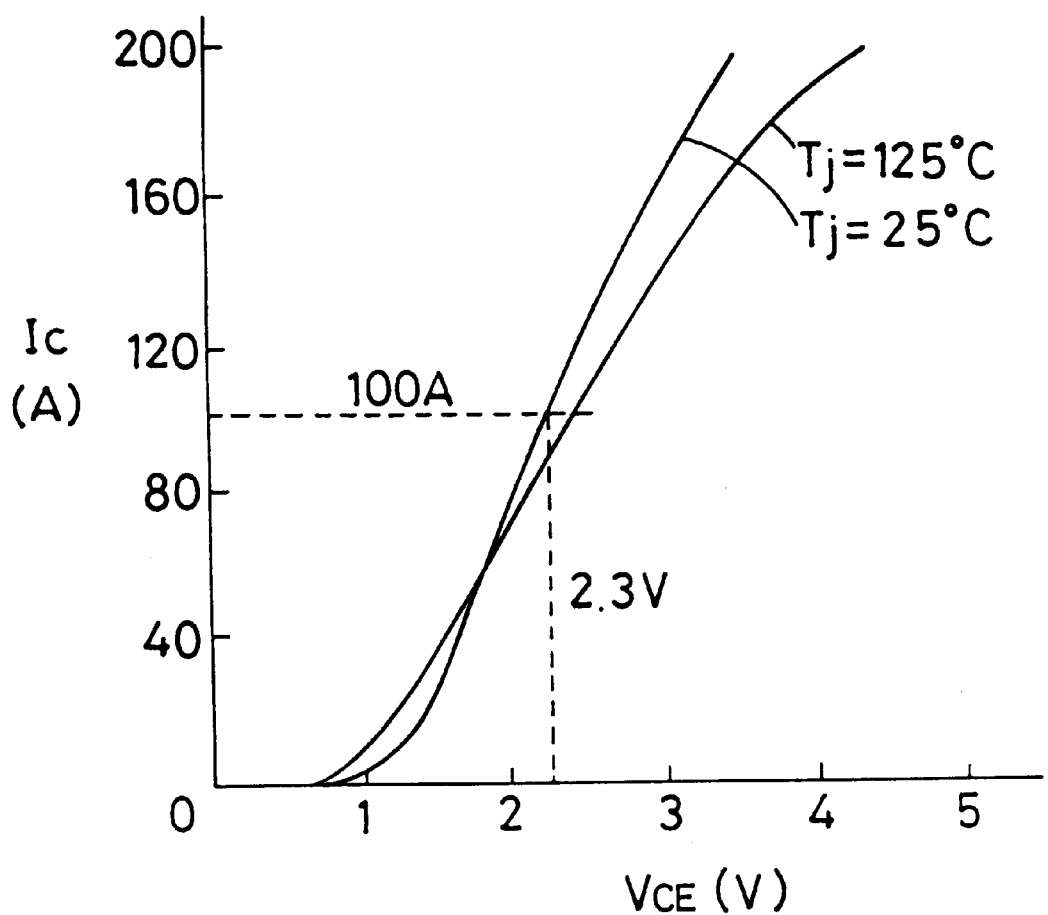
FIG. 7 is a graph showing results of a verification test.

FIGS. 6 and 7 are graphs showing results of output characteristics of the device according to the embodiment having the high concentration n-type semiconductor region 21 of a proper shape and the conventional device having no such region, respectively. The saturation voltage $V_{CE}(\text{sat})$ of each of these devices is defined by the collector voltage $V_{CE}$ corresponding to 100 A, which is the rated value of the collector current $I_C$. As read from FIG. 6, therefore, the saturation voltage $V_{CE}(\text{sat})$ at a junction temperature $T_j=25°$ C. is 2.0 V in the device according to the embodiment.

In the conventional device, on the other hand, the saturation voltage $V_{CE}(\text{sat})$ is 2.3 V at the same temperature, as understood from FIG. 7. Namely, the saturation voltage $V_{CE}(\text{sat})$ is improved by about 0.3 V as compared with the conventional device under the junction temperature $T_j=25°$ C. Also in comparison under a junction temperature $T_j=125°$ C., an improvement of about 0.3 V can be similarly confirmed.

Figure 8:
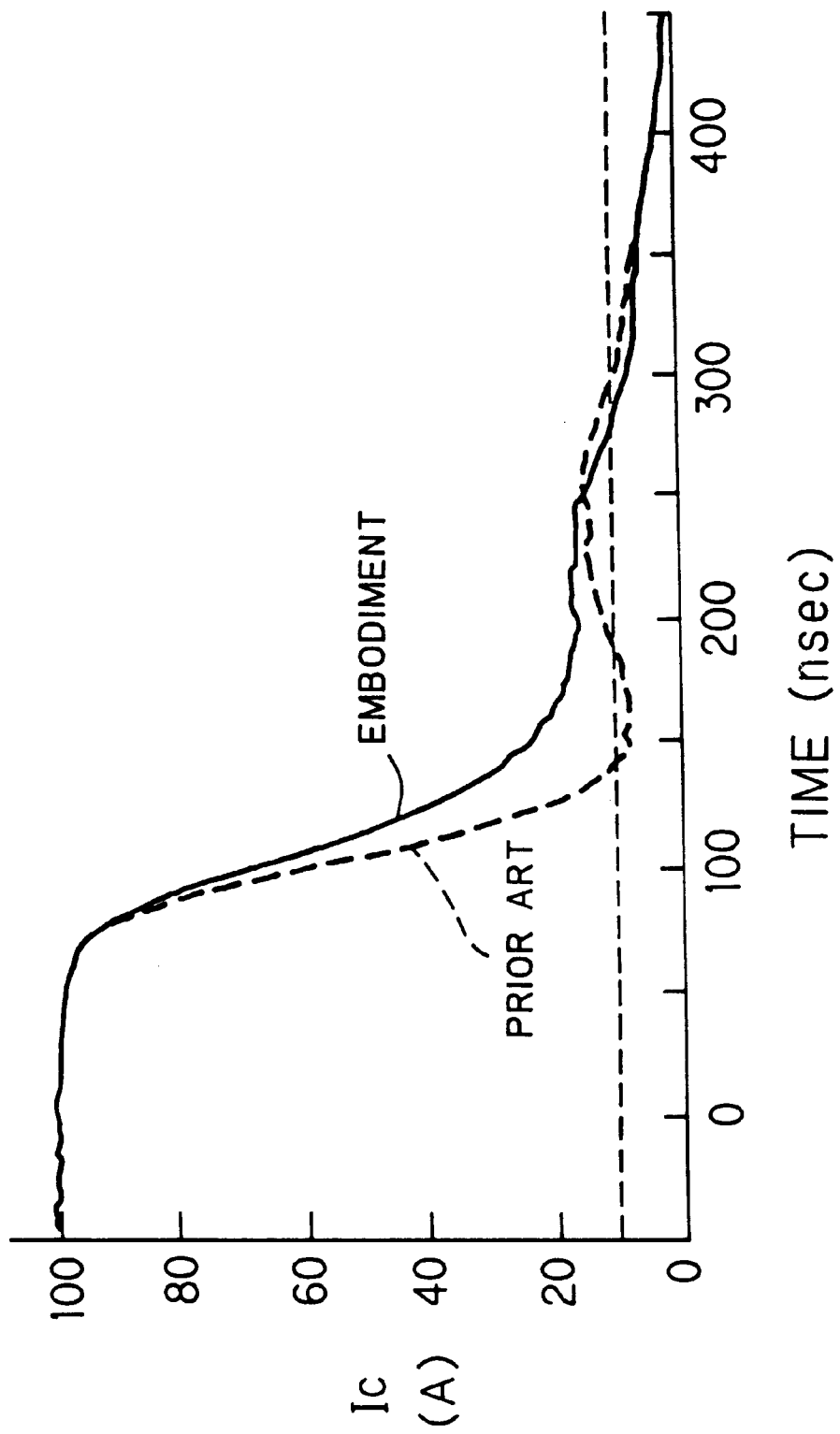
FIG. 8 is a graph showing results of a verification test.

FIG. 8 is a graph showing results of observation of waveforms of the collector currents $I_C$ during turning-off as to these devices. In an initial stage of the turn-off process, attenuation of the collector current $I_C$ in the conventional device is quicker than in the device according to this embodiment. In a tail region which is the last half of the turn-off process, i.e., in a region where the collector current $I_C$ remains in the form of a tail current, the collector current $I_C$ is attenuated at a higher speed in the device according to the embodiment as compared with the conventional device.

The fall time $t_f$ is defined by a time required for attenuating the collector current $I_C$ from 90% of the current value in an ON state to 10%. Therefore, the fall time $t_f$ is about 200 nsec. in the device according to the embodiment, and about 220 nsec. in the conventional device. Namely, the fall time $t_f$ is improved by about 20 nsec. in the device according to the embodiment, as compared with the conventional device.

In the device according to the embodiment which is set in the region A in FIG. 5, as hereinabove described, both of the saturation voltage $V_{CE}$(sat) and the fall time $t_f$ are improved as compared with the conventional device. This backs up properness of the conditions derived on the basis of the simulations in relation to the width W and the distance D.

2. Embodiment 2

Figure 9:
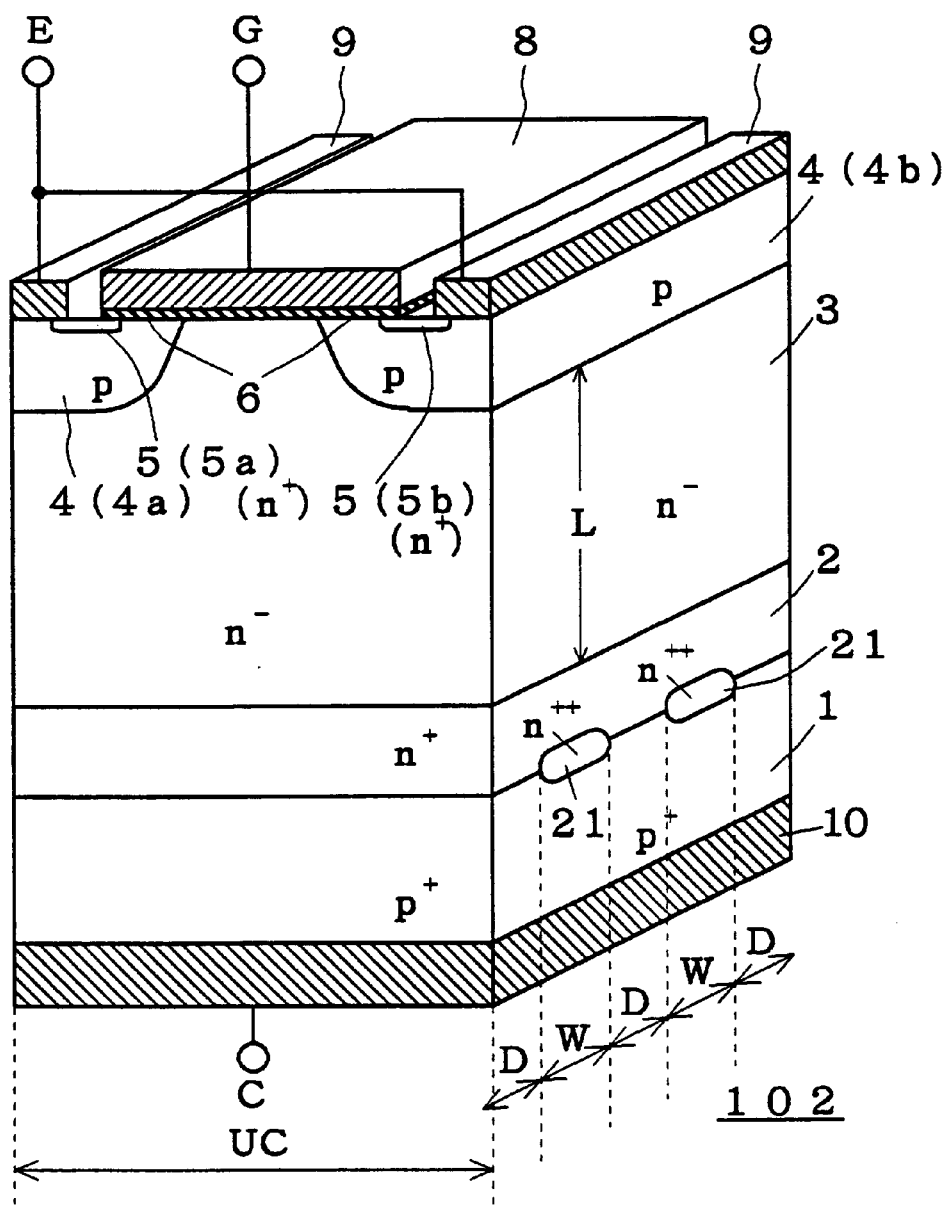
FIG. 9 is a fragmented perspective view showing a device according to an embodiment 2.

FIG. 9 is a fragmented perspective view showing the structure of an IGBT according to an embodiment 2. In a device 102 according to this embodiment, a strip-shaped high concentration n-type semiconductor region 21 is arranged in a direction which is different from that of the device 101 according to the embodiment 1. In the device according to this embodiment, the strip-shaped high concentration n-type semiconductor region 21 extending over the boundary between a buffer layer 2 and a p-type semiconductor layer 1 is arranged to perpendicularly aerially intersect (two-level-cross) with a strip-shaped p-type base layer 4. In other words, the high concentration n-type semiconductor region 21 perpendicularly aerially intersects (two-level-cross) with a channel region 6 which is formed to unidirectionally extend along an upper major surface of a semiconductor body 12.

Therefore, no limitation is present in the relative positions of the p-type base layer 4 and the high concentration n-type semiconductor region 21, whereby it is not necessary to align a mask pattern for forming the high concentration n-type semiconductor region 21 in steps of fabricating the device. Namely, the fabrication steps are advantageously simplified. At the same time, homogeneity in characteristics of the device is advantageously improved every product. While the p-type base layer 4 and the high concentration n-type semiconductor region 21 perpendicularly intersect with each other in FIG. 9, a similar effect is attained when the same intersect with each other at a certain degree of angle.

3. Embodiment 3

Figure 10:
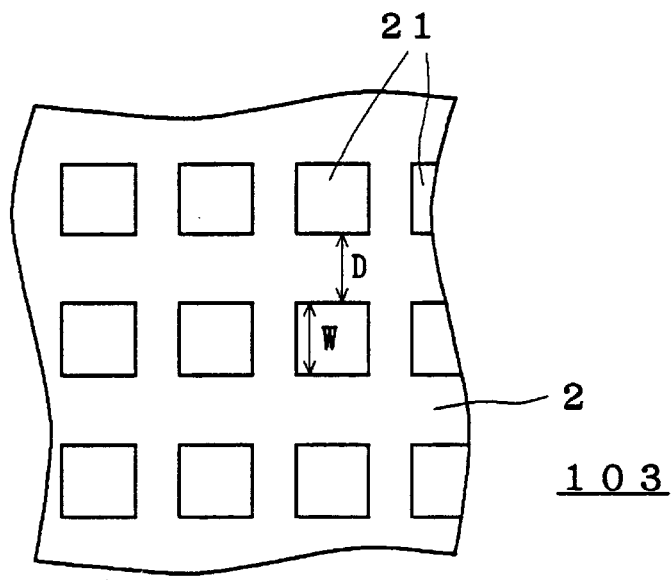
FIG. 10 is a plan sectional view showing a device according to an embodiment 3.

FIG. 10 is a sectional plan view showing the shape of a high concentration n-type semiconductor region 21 of an IGBT according to an embodiment 3. In this device 103, the high concentration n-type semiconductor region 21 is formed by arranging a number of island regions which are isolated from each other in the form of a matrix. Similarly to the device 102 according to the embodiment 2, therefore, it is not necessary to align the high concentration n-type semiconductor region 21 with a p-type base layer 4, whereby fabrication is easy.

As shown in FIG. 10, the distance D of the high concentration n-type semiconductor region 21 is defined as a space between the island regions which are adjacent to each other, while the width W is defined as that of each island region. Thus, the conditions related to the width W and the distance D shown in FIG. 5 are applicable to the device 103 as such. While each island region has a square plan contour in FIG. 10, the same may alternatively have a rectangular shape or still another shape, in general.

4. Embodiment 4

Figure 11:
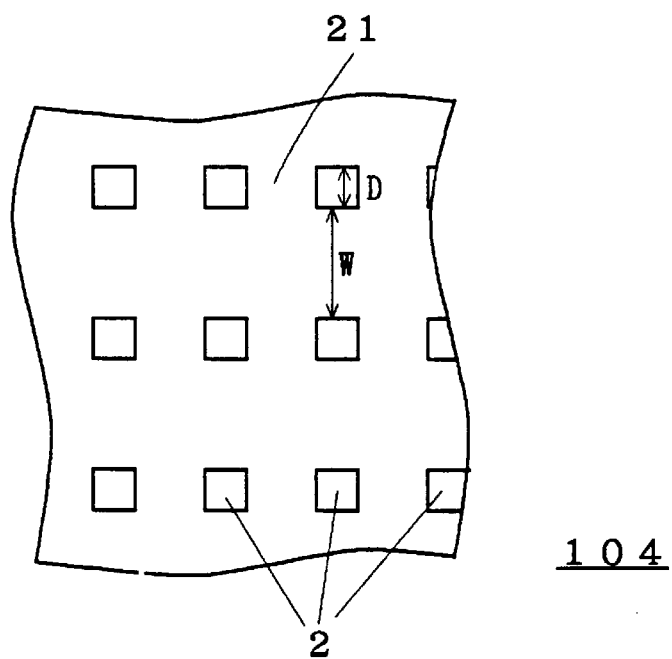
FIG. 11 is a plan sectional view showing a device according to an embodiment 4.

FIG. 11 is a sectional plan view showing the shape of a high concentration n-type semiconductor region 21 of an IGBT according to an embodiment 4. In this device 104, the high concentration n-type semiconductor region 21 is arranged in the form of a cross stripe defining square clearances. Namely, patterns of the high concentration n-type semiconductor region 21 and buffer layers 2 of this device are in shapes as if patterns of the high concentration n-type semiconductor region 21 and a buffer layer 2 of the device 103 are replaced with each other.

Also in this device 104, it is not necessary to align a p-type base layer 4 and the high concentration n-type semiconductor region 21 with each other similarly to the devices 102 and 103, whereby fabrication is advantageously easy. As shown in FIG. 11, further, the width W is defined as that of a strip, and the distance D is defined as a space between adjacent strips, i.e., the width of the clearance. Thus, the conditions related to the width W and the distance D shown in FIG. 5 are also applicable to the device 104 as such.

While the clearances defined by the high concentration n-type semiconductor region 21 have square plan contours in FIG. 11, the same may alternatively be rectangular or other shapes other than squares, in general.

5. Embodiment 5

Figure 12:
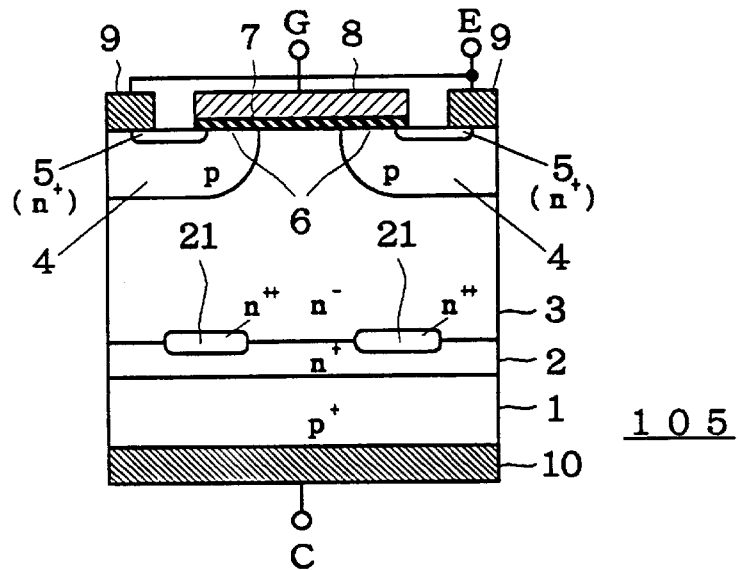
FIG. 12 is a front sectional view showing a device according to an embodiment 5.

FIG. 12 is a front sectional view showing the structure of an IGBT according to an embodiment 5. This device 105 is characteristically different from the device 101 of the embodiment 1 in a point that a high concentration n-type semiconductor region 21 is arranged to extend over the boundary between a buffer layer 2 and an n-type semiconductor layer 3. An effect which is identical to that of the device 101 can be attained also by arranging the high concentration n-type semiconductor region 21 in this manner.

6. Embodiment 6

Figure 13:
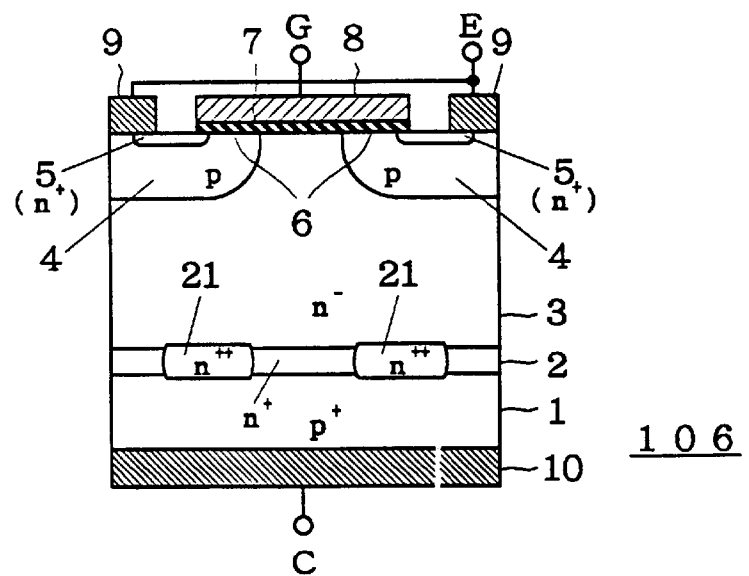
FIG. 13 is a front sectional view showing a device according to an embodiment 6.

FIG. 13 is a front sectional view showing the structure of an IGBT according to an embodiment 6. This device 106 is characteristically different from the device 101 of the embodiment 1 in a point that a high concentration n-type semiconductor region 21 is arranged to pass through a buffer layer 2 from its upper major surface to its lower major surface. An effect which is identical to that of the device 101 can be attained also by arranging the high concentration n-type semiconductor region 21 in this manner.

In general, holes behave identically when a path in which only the buffer layer 2 is interposed and that in which the high concentration n-type semiconductor region 21 is interposed are arranged in parallel with each other in the path of the holes flowing from a p-type semiconductor layer 1 toward an n-type semiconductor layer 3. Therefore, the high concentration n-type semiconductor region 21 may be arranged to be at least partially overlapped with or to be adjacent to the buffer layer 2.

7. Embodiment 7

Figure 14:
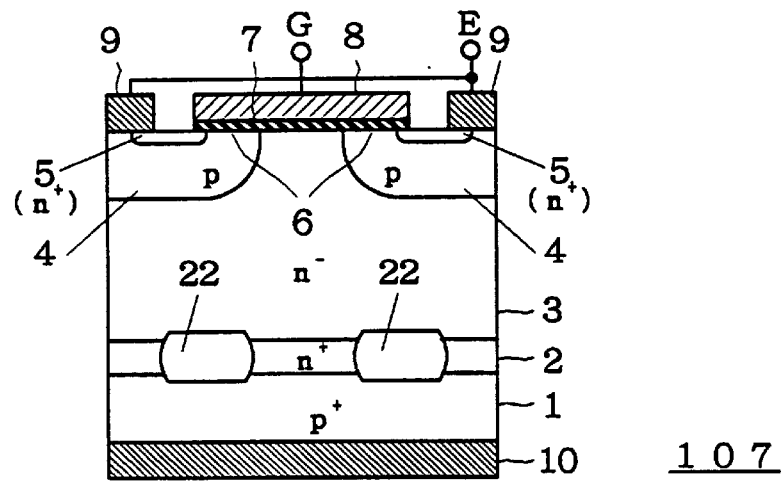
FIG. 14 is a front sectional view showing a device according to an embodiment 7.

FIG. 14 is a front sectional view showing the structure of an IGBT according to an embodiment 7. In this device 107, the high concentration n-type semiconductor region 21 in the device 106 of the embodiment 6 is replaced with a damage region 22 containing a number of crystal defects. This damage region 22 is formed in the shape of a strip, similarly to the high concentration n-type semiconductor region 21 of the device 106.

The damage region 22 is formed by introducing the crystal defects into the buffer layer 2 in a high density by selectively applying charged particles of proton or the like. Recombination of carriers is facilitated in the damage region 22, since the same contains the crystal defects in a large amount. Therefore, the lifetimes of the holes are reduced in the damage region 22. Namely, the damage region 22 is adapted to reduce the lifetimes of the holes, similarly to the high concentration n-type semiconductor region 21.

Therefore, the damage region 22 brings effects which are similar to those of the high concentration n-type semiconductor region 21 with respect to characteristics such as the saturation voltage $V_{CE}(sat)$, the fall time $t_f$ and the like. Therefore, the conditions shown in FIG. 5 are also applicable to the damage region 22 of the device 107 as such. While the damage region 22 is formed in the interior of the buffer layer 2 in the device 107, the damage region 22 may be arranged to be at least partially overlapped with or to be adjacent to the buffer layer 2 similarly to the high concentration n-type semiconductor region 21, in general.

8. Embodiment 8

Figure 15:
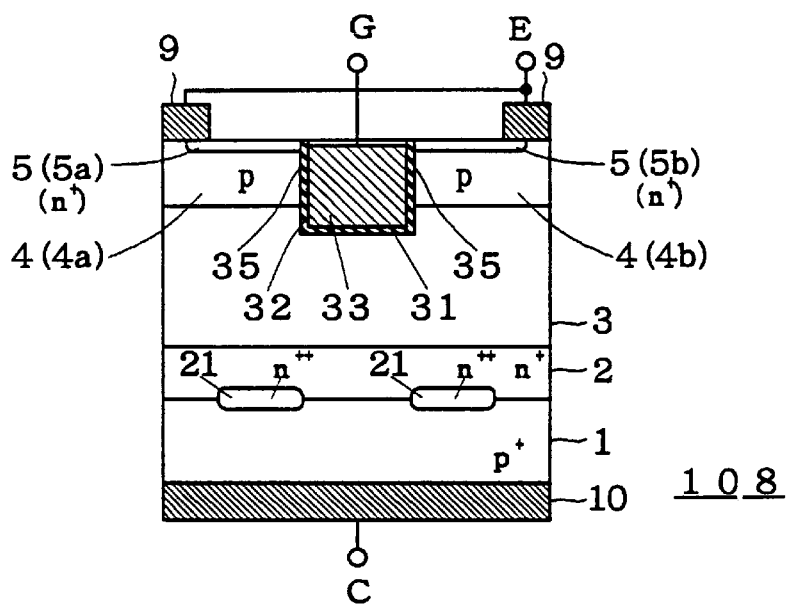
FIG. 15 is a front sectional view showing a device according to an embodiment 8.

FIG. 15 is a front sectional view showing the structure of an IGBT according to an embodiment 8. In this device 108, the MOS structure which is formed in the vicinity of the upper major surface of the semiconductor body 12 in the device 101 of the embodiment 1 (FIG. 1) is replaced with a trench gate type MOS structure which is similar to that of the conventional device 152 (FIG. 37).

Also when the MOS structure has a trench gate, the saturation voltage $V_{CE}(sat)$ and the fall time $t_f$ are compatibly improved as compared with the conventional device having the same trench gate type MOS structure when the conditions shown in FIG. 5 are applied to the shape of a high concentration n-type semiconductor region 21.

Also in the IGBT having a trench gate, the high concentration n-type semiconductor region 21 can be formed to perpendicularly aerially intersect (two-level-cross) with a channel region 35 which is formed to unidirectionally extend parallel to an upper major surface of a semiconductor body 12 similarly to the device 102 of the embodiment 2, although the same is not shown. Thus, no alignment is required between the high concentration n-type semiconductor region 21 and the channel region 35, whereby the fabrication steps can be simplified. The high concentration n-type semiconductor region 21 can also be formed in the shape shown in FIG. 10 or 11.

9. Embodiment 9

A preferred mode of a method of fabricating the device of each of the aforementioned embodiments is now described. FIGS. 16 to 19 are fabrication step diagrams showing respective stages of a method which is suitable for fabricating the device according to each of the embodiments 1 to 4 and 8, i.e., such a device that the high concentration n-type semiconductor region 21 is formed on the boundary (unction plane) between the buffer layer 2 and the p-type semiconductor layer 1.

Figure 16:
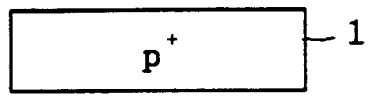
FIG. 16 is a step diagram showing a fabrication method according to an embodiment 9.

In order to fabricate such a device, a p-type semiconductor substrate corresponding to the p-type semiconductor layer 1 is first prepared, as shown in FIG. 16. The prepared semiconductor substrate is a silicon substrate, for example.

Figure 17:
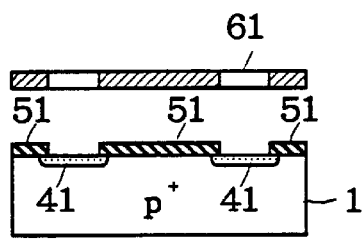
FIG. 17 is a step diagram showing the fabrication method according to the embodiment 9.

Then, a resist layer is provided on the overall upper major surface of the semiconductor substrate, and photolithography of the resist layer is performed through a mask 61 having a prescribed patterning shape, thereby obtaining a resist pattern 51 (screen) selectively having an opening, as shown in FIG. 17. Thereafter the resist pattern 51 is employed as a mask for selectively injecting an n-type impurity such as arsenic through the opening, thereby selectively forming an n-type semiconductor region 41 on the upper major surface of the semiconductor substrate.

Figure 18:
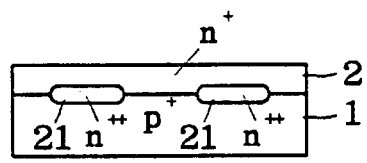
FIG. 18 is a step diagram showing the fabrication method according to the embodiment 9.
Figure 19:
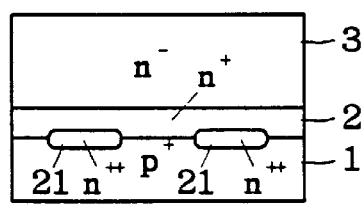
FIG. 19 is a step diagram showing the fabrication method according to the embodiment 9.

Then, the resist pattern 51 is removed, and thereafter a buffer layer 2 is deposited on the semiconductor substrate, i.e., the p-type semiconductor layer 1, by epitaxy, as shown in FIG. 18. Then, an n-type semiconductor layer 3 is deposited on the buffer layer 2 by epitaxy, as shown in FIG. 19. In the process of the epitaxy, the n-type impurity of the n-type semiconductor region 41 is diffused in the periphery, whereby the high concentration n-type semiconductor region 21 is formed over the boundary between the buffer layer 2 and the p-type semiconductor layer 1.

Thereafter a MOS structure is formed on an upper major surface part of the n-type semiconductor layer 3, and a gate insulating film 7, a gate electrode 8, an emitter electrode 9 and a collector electrode 10 are formed. The well-known steps employed for fabricating the conventional device shown in FIG. 36 or 37 are applied to these steps as such.

In the aforementioned steps, the shape of the mask 61 is previously decided so that the shape of the high concentration n-type semiconductor region 21 which is finally formed by the n-type impurity introduced through a transferred resist pattern 51 and diffused coincides with that of the high concentration n-type semiconductor region 21 according to each of the embodiments 1 to 4 and 8.

The amount of the n-type impurity which is introduced through the resist pattern 51 is so adjusted that the concentration in the high concentration n-type semiconductor region 21 finally formed through the diffusion step is about $1\times10^{18}$ to $1\times10^{21}$ cm$^{-3}$. Further, the steps of epitaxially growing the buffer layer 2 and the n-type semiconductor layer 3 are so executed that the concentrations of the n-type impurities contained in these layers are about $5\times10^{14}$ to $1\times10^{17}$ cm$^{-3}$ and about $2\times10^{14}$ cm$^{-3}$ when the rated voltage is 600 V, respectively.

The device 106 of the embodiment 6 can be fabricated by thinly depositing the buffer layer 2 so that the high concentration n-type semiconductor region 21 is diffused to the upper major surface of the finally formed buffer layer 2.

10. Embodiment 10

Figure 20:
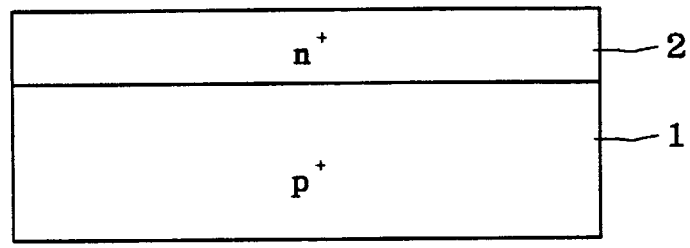
FIG. 20 is a step diagram showing a fabrication method according to an embodiment 10.
Figure 21:
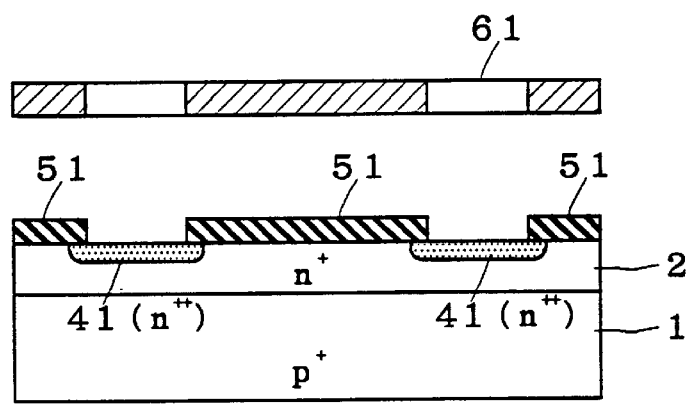
FIG. 21 is a step diagram showing the fabrication method according to the embodiment 10.
Figure 22:
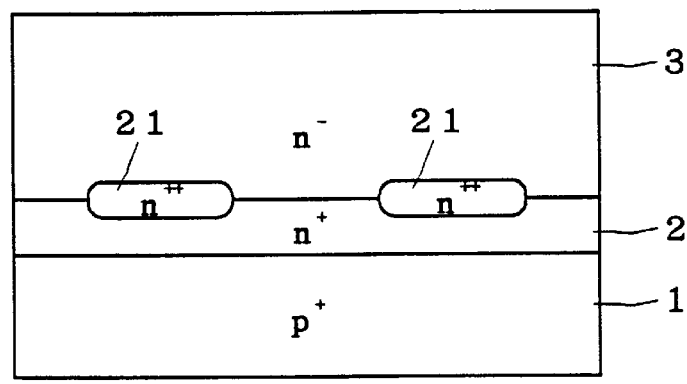
FIG. 22 is a step diagram showing the fabrication method according to the embodiment 10.

FIGS. 20 to 22 are fabrication step diagrams showing respective stages of a method which is suitable for fabricating the device of the embodiment 5, i.e., such a device that the high concentration n-type semiconductor region 21 is formed on the boundary between the buffer layer 2 and the n-type semiconductor layer 3. In order to fabricate this device, the steps of forming the n-type semiconductor region 41 and depositing the buffer layer 2 in the fabrication method of the embodiment 9 may be executed in replaced order.

Namely, a buffer layer 2 is formed by epitaxy on a prepared p-type semiconductor substrate (corresponding to the p-type semiconductor layer 1), as shown in FIG. 20. Alternatively, an n-type impurity is introduced into and diffused in a major surface of the prepared p-type semiconductor substrate, thereby forming a structure (FIG. 20) in which the buffer layer 2 is stacked on the p-type semiconductor layer 1.

Thereafter an n-type impurity is selectively injected through a resist pattern 51 to which a mask 61 is transferred, thereby forming an n-type semiconductor region 41 on the buffer layer 2, as shown in FIG. 21.

Then, the resist pattern 51 is removed, and thereafter an n-type semiconductor layer 3 is deposited on the buffer layer 2 by epitaxy, as shown in FIG. 22. In this process, the n-type impurity of the n-type semiconductor region 41 is diffused in the periphery, whereby a high concentration n-type semiconductor region 21 is formed over the boundary between the buffer layer 2 and the n-type semiconductor layer 3.

Subsequent steps are similar to those of the embodiment 9. Further, the condition related to the shape of the mask 61 to be prepared, the concentration of the introduced n-type impurity and the like are also similar to those of the embodiment 9. In addition, the device 106 of the embodiment 6 can be fabricated by thinly depositing the buffer layer 2 so that the high concentration n-type semiconductor region 21 is diffused up to the lower major surface of the buffer layer 2.

11. Embodiment 11

The device according to each of the embodiments 1 to 4 and 8, i.e., such a device that the high concentration n-type semiconductor region 21 is formed on the boundary (junction plane) between the buffer layer 2 and the p-type semiconductor layer 1, can also be fabricated by first preparing a semiconductor substrate corresponding to the n-type semiconductor layer 3 in place of the semiconductor substrate corresponding to the p-type semiconductor layer 1. FIGS. 23 to 26 are step diagrams showing an example of this fabrication method. In these figures, the top and bottom are inverted as to the directions in ordinary fabrication steps, taking precedence over alignment with FIG. 1 etc showing the sectional structure of the final device after completion.

Figure 23:
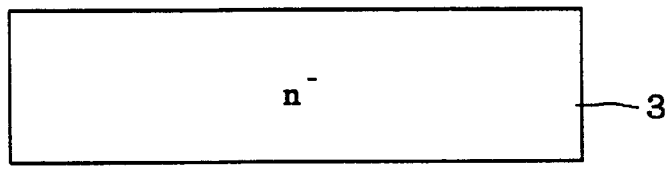
FIG. 23 is a step diagram showing a fabrication method according to an embodiment 11.
Figure 24:
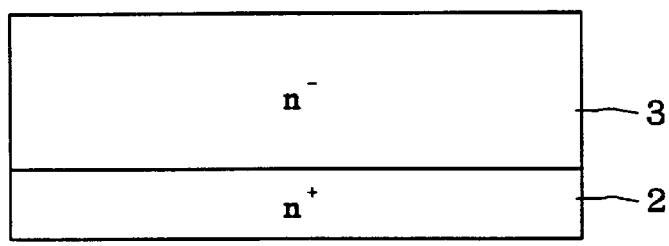
FIG. 24 is a step diagram showing the fabrication method according to the embodiment 11.

According to this method, an n-type semiconductor substrate corresponding to the n-type semiconductor layer 3 is first prepared, as shown in FIG. 23. Then, a buffer layer 2 is deposited on one major surface of the semiconductor substrate by epitaxy, as shown in FIG. 24. Alternatively, an n-type impurity is introduced in high concentration and diffused in the major surface of the semiconductor substrate after preparation of the n-type semiconductor substrate, thereby forming such a structure that the n-type semiconductor layer 3 and the buffer layer 2 are stacked with each other (FIG. 24).

Figure 25:
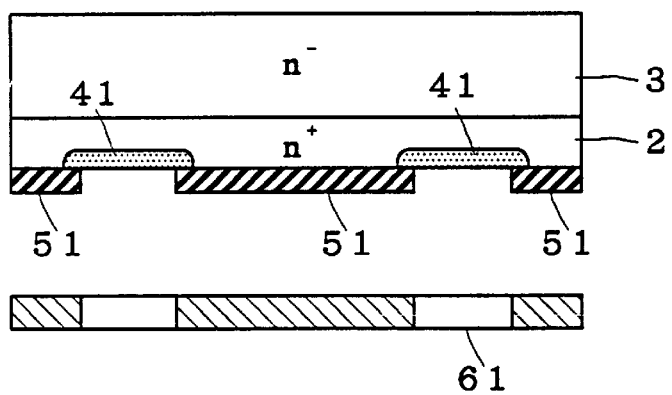
FIG. 25 is a step diagram showing the fabrication method according to the embodiment 11.

Then, a resist layer is provided on the overall major surface of the buffer layer 2 and photolithography of the resist layer is performed through a mask 61, thereby obtaining a resist pattern 51 (screen), as shown in FIG. 25. Then, an n-type impurity such as arsenic is selectively injected through the resist pattern 51 serving as a mask, thereby selectively forming an n-type semiconductor region 41 on a major surface of the buffer layer 2.

Figure 26:
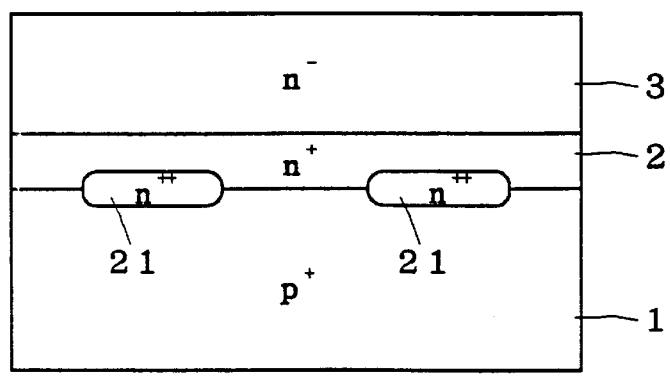
FIG. 26 is a step diagram showing the fabrication method according to the embodiment 11.

Then, the resist pattern 51 is removed, and a p-type semiconductor layer 1 is formed on the major surface of the buffer layer 2 by epitaxy, as shown in FIG. 26. In this process, the n-type impurity of the n-type semiconductor region 41 is diffused in the periphery, whereby a high concentration n-type semiconductor region 21 is formed to extend over the p-type semiconductor layer 1 and the buffer layer 2.

Subsequent steps are similar to those of the embodiment 9. Further, the condition related to the shape of the mask 61 to be prepared, the concentration of the introduced n-type impurity and the like are also similar to those of the embodiment 9. In addition, the device 106 of the embodiment 6 can be fabricated by thinly depositing the buffer layer 2 so that the high concentration n-type semiconductor region 21 is diffused up to the boundary between the buffer layer 2 and the n-type semiconductor layer 3.

While the n-type impurity concentration in the n-type semiconductor layer 3 must be precisely adjusted, the p-type impurity concentration in the p-type semiconductor layer 1 may be relatively roughly adjusted. According to this embodiment, the n-type semiconductor layer 3 requiring precise adjustment of the impurity concentration is previously prepared as the substrate while the p-type semiconductor layer 1 requiring relatively not precise adjustment is formed by epitaxy, whereby the n-type impurity concentration can be precisely adjusted in the n-type semiconductor layer 3, while fabrication of the p-type semiconductor layer 1 is easy.

12. Embodiment 12

The device of the embodiment 5, i.e., such a device that the high concentration n-type semiconductor region 21 is formed on the boundary between the buffer layer 2 and the n-type semiconductor layer 3, can also be fabricated by first preparing a semiconductor substrate corresponding to the n-type semiconductor layer 3 in place of the semiconductor substrate corresponding to the p-type semiconductor layer 1. In this case, the steps of forming the n-type semiconductor region 41 and depositing the buffer layer 2 in the method of the embodiment 11 may be executed in replaced order.

Figure 27:
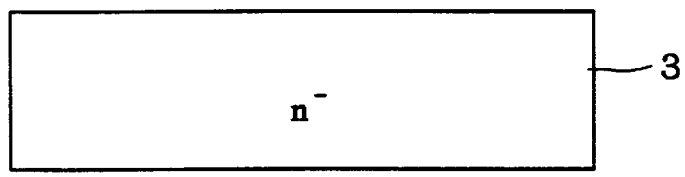
FIG. 27 is a step diagram showing a fabrication method according to an embodiment 12.
Figure 28:
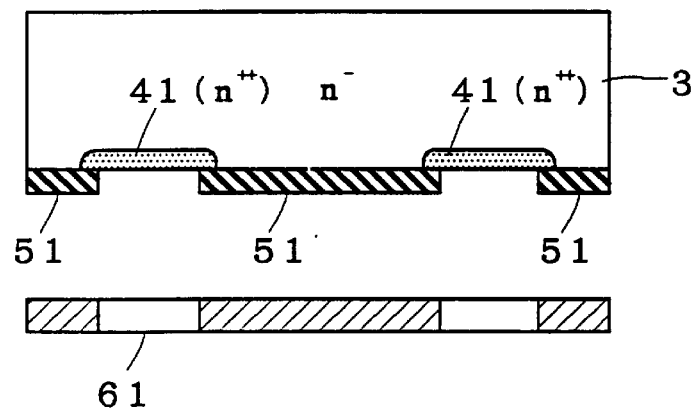
FIG. 28 is a step diagram showing the fabrication method according to the embodiment 12.
Figure 29:
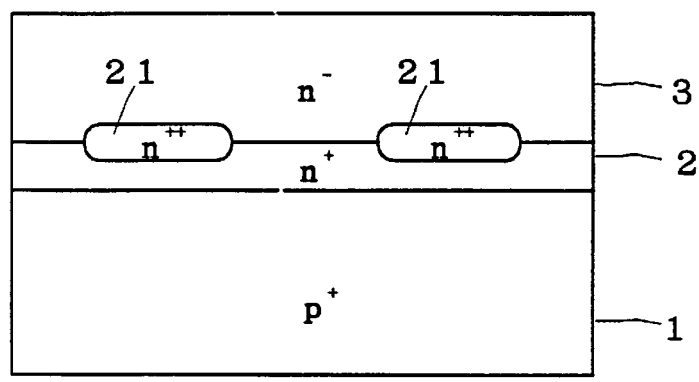
FIG. 29 is a step diagram showing the fabrication method according to the embodiment 12.

FIGS. 27 to 29 are step diagrams showing an example of this fabrication method. Also in these figures, the top and bottom are inverted as to the directions in ordinary fabrication steps, taking precedence over alignment with FIG. 12 showing the sectional structure of the final device after completion etc.

In this fabrication method, an n-type semiconductor substrate corresponding to the n-type semiconductor layer 3 is first prepared, as shown in FIG. 27. Thereafter an n-type impurity is selectively injected through a resist pattern 51 to which a mask 61 is transferred, thereby forming an n-type semiconductor region 41 on one major surface of the semiconductor substrate, as shown in FIG. 28.

Then, the resist pattern 51 is removed, and thereafter a buffer layer 2 is deposited on the major surface of the semiconductor substrate by epitaxy, as shown in FIG. 29. Thereafter a p-type semiconductor layer 1 is deposited on the buffer layer 2 by epitaxy. In the epitaxial process, the n-type impurity of the n-type semiconductor region 41 is diffused in the periphery, whereby a high concentration n-type semiconductor region 21 is formed to extend over the boundary between the buffer layer 2 and the n-type semiconductor layer 3.

Subsequent steps are similar to those of the embodiment 9. Further, the condition related to the shape of the mask 61 to be prepared, the concentration of the introduced n-type impurity and the like are also similar to those of the embodiment 9. In addition, the device 106 of the embodiment 6 can be fabricated by thinly depositing the buffer layer 2 so that the high concentration n-type semiconductor region 21 is diffused up to the surface of the finally formed buffer layer 2.

Also in this embodiment, the n-type semiconductor layer 3 requiring precise adjustment of the impurity concentration is previously prepared as the substrate while the p-type semiconductor layer 1 requiring relatively not precise adjustment is formed by epitaxy, whereby the n-type impurity concentration can be precisely adjusted in the n-type semiconductor layer 3, while fabrication of the p-type semiconductor layer 1 is easy.

13. Embodiment 13

Figure 30:
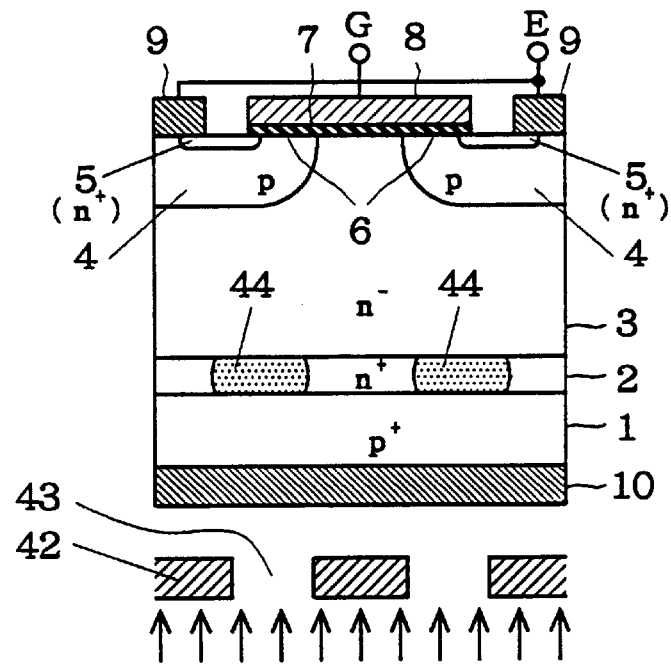
FIG. 30 is a step diagram showing a fabrication method according to an embodiment 13.

A method which is suitable for fabricating the device of the embodiment 7 is described. FIG. 30 is a fabrication step diagram for illustrating this method. In order to fabricate the device of the embodiment 7, the conventional device 151 (FIG. 36) is first fabricated. Its semiconductor body 12 includes a pnp bipolar structure which is formed by successively stacking a p-type semiconductor layer 1, a buffer layer 2, an n-type semiconductor layer 3 and a p-type base layer 4.

Thereafter a mask 42 having a prescribed pattern shape is formed by aluminum or stainless steel, for example, as shown in FIG. 30. This mask 42 is employed as a screen for selectively irradiating the device with charged particles of proton or the like, for example. As shown in FIG. 30, the device is preferably irradiated from the side of a collector electrode 10.

The energy of the charged particles is so adjusted that the charged particles are stopped in the interior of the buffer layer 2 or a region adjacent to the buffer layer 2. Consequently, the charged particles entering the interior of the device through an opening 43 of the mask 42 selectively form crystal defects in the interior of the buffer 2 or the region adjacent thereto. FIG. 30 shows such an example that this damage region 44 is formed in the interior of the buffer 2.

Thereafter the temperature of the device is increased to about 350° C. and the damage region 44 is diffused, thereby forming the damage region 22 shown in FIG. 14. The pattern shape of the mask 42, i.e., the shape of the opening 43, is previously set so that the damage region 22 formed through the diffusion step has a desired shape satisfying the conditions shown in FIG. 5.

The diffusion step may alternatively be omitted, so that the damage region 44 is not diffused but defines the damage region 22 as such. In this case, patterning of the mask 42 is easy since diffusion of the damage region 44 may not be taken into consideration.

14. Embodiment 14

Figure 31:
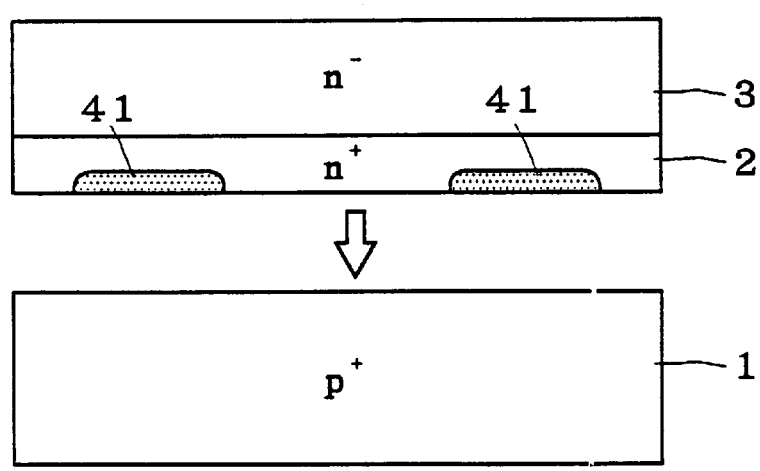
FIG. 31 is a step diagram showing a fabrication method according to an embodiment 14.

In the following embodiments 14 to 17, further preferable modes of methods of fabricating the devices according to the embodiments 1 to 6 and 8 are described. In each of these modes, a direct bonding technique of bonding two types of semiconductor substrates with each other is employed. FIG. 31 is a fabrication step diagram showing a step of a method which is suitable for fabricating the device according to each of the embodiments 1 to 4 and 8, i.e., such a device that the high concentration n-type semiconductor region 21 is formed on the boundary (junction plane) between the buffer layer 2 and the p-type semiconductor layer 1.

In order to fabricate this device, the steps of FIGS. 23 to 25 are first executed thereby forming one semiconductor substrate shown in FIG. 31, i.e., a substrate having an n-type semiconductor layer 3, a buffer layer 2 and an n-type semiconductor region 41. In parallel with or around these steps, the step shown in FIG. 16, i.e., a step of preparing another semiconductor substrate corresponding to the p-type semiconductor layer 1 is executed.

Then, the semiconductor substrates are bonded with each other through the direct bonding technique, as shown in FIG. 31. Consequently, the structure shown in FIG. 26 is finished. In the direct bonding technique, surfaces of the semiconductor substrates to be bonded with each other are washed and thereafter brought into close contact with each other in moistened states. Then, a heat treatment of about 900° C. to 1100° C., for example, is performed while maintaining the close contact state, thereby implementing bonding of the substrates. Due to the heat treatment following the direct bonding, the n-type impurity of the n-type semiconductor region 41 is diffused in the periphery, whereby a high concentration n-type semiconductor region 21 is formed to extend over the boundary between a buffer layer 2 and a p-type semiconductor layer 1, as shown in FIG. 26.

Subsequent steps are similar to those of the embodiment 9. Further, the condition related to the shape of the mask 61 to be prepared, the concentration of the introduced n-type impurity and the like are also similar to those of the embodiment 9. In addition, the device 106 of the embodiment 6 can be fabricated by thinly depositing the buffer layer 2 so that the high concentration n-type semiconductor region 21 is diffused up to the upper major surface of the finally formed buffer layer 2, also similarly to the embodiment 9.

15. Embodiment 15

Figure 32:
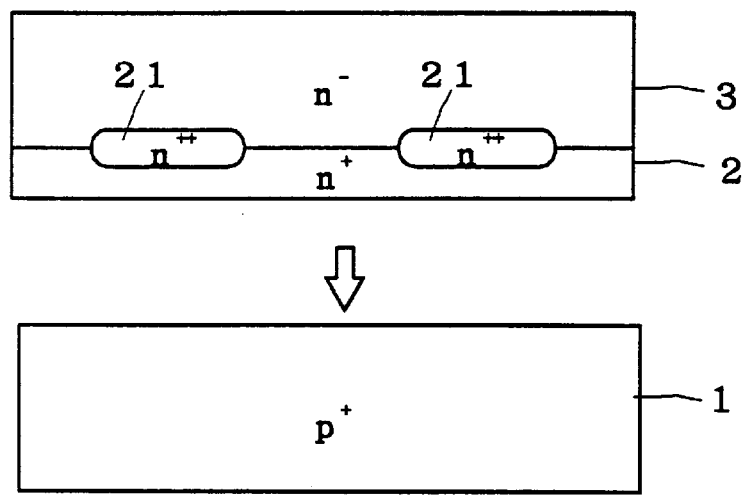
FIG. 32 is a step diagram showing a fabrication method according to an embodiment 15.

FIG. 32 is a fabrication step diagram showing a step of a method which is suitable for fabricating the device of the embodiment 5, i.e., such a device that the high concentration n-type semiconductor region 21 is formed on the boundary between the buffer layer 2 and the n-type semiconductor layer 3.

In order to fabricate this device, the steps of FIGS. 27 and 28 are first executed. Thereafter the resist pattern 51 is removed, and a buffer layer 2 is deposited on one major surface of a semiconductor substrate forming the n-type semiconductor layer 3 by epitaxy. In the process of the epitaxy, the n-type impurity of the n-type semiconductor region 41 is diffused in the periphery, whereby a high concentration n-type semiconductor region 21 is formed to extend over the boundary between the buffer layer 2 and the n-type semiconductor layer 3. Due to these steps, one semiconductor substrate shown in FIG. 32, i.e., a substrate having a n-type semiconductor layer 3, a buffer layer 2 and a high concentration n-type semiconductor region 21 is obtained.

In parallel with or around these steps, the step shown in FIG. 16, i.e., a step of preparing another semiconductor substrate corresponding to the p-type semiconductor layer 1 is executed. Then, the semiconductor substrates are bonded with each other by the direct bonding technique, as shown in FIG. 32. Consequently, the structure shown in FIG. 29 is finished. Due to a heat treatment following the direct bonding, the impurity in the high concentration n-type semiconductor region 21 is further diffused.

Subsequent steps are similar to those of the embodiment 9. Further, the condition related to the shape of the mask 61 to be prepared, the concentration of the introduced n-type impurity and the like are also similar to those of the embodiment 9. In addition, the device 106 of the embodiment 6 can be fabricated by thinly depositing the buffer layer 2 so that the high concentration n-type semiconductor region 21 is diffused up to the lower major surface of the buffer layer 2.

16. Embodiment 16

Figure 33:
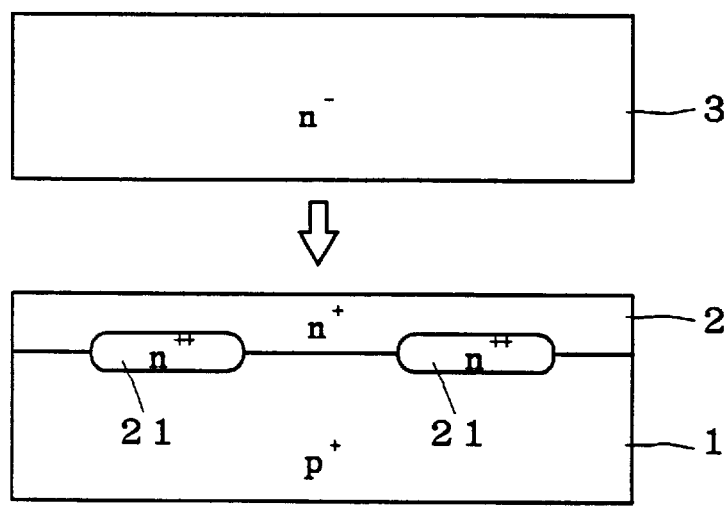
FIG. 33 is a step diagram showing a fabrication method according to an embodiment 16.

FIG. 33 is a fabrication step diagram showing a step of a further method which is suitable for fabricating the device according to each of the embodiments 1 to 4 and 8, i.e., such a device that the high concentration n-type semiconductor region 21 is formed on the boundary (unction plane) between the buffer layer 2 and the p-type semiconductor layer 1.

In order to fabricate this device, the steps of FIGS. 16 to 18 are first executed, for forming one semiconductor substrate shown in FIG. 33, i.e., a substrate having a p-type semiconductor layer 1, a buffer layer 2 and a high concentration n-type semiconductor region 21. In parallel with or around these steps, the step shown in FIG. 23, i.e., a step of preparing another semiconductor substrate corresponding to the n-type semiconductor layer 3 is executed.

Then, the semiconductor substrates are bonded with each other through the direct bonding technique, as shown in FIG. 33. Consequently, the structure shown in FIG. 19 is finished. Due to a heat treatment following the direct bonding, the impurity in the high concentration n-type semiconductor region 21 is further diffused.

Subsequent steps are similar to those of the embodiment 9. Further, the condition related to the shape of the mask 61 to be prepared, the concentration of the introduced n-type impurity and the like are also similar to those of the embodiment 9. In addition, the device 106 of the embodiment 6 can be fabricated by thinly depositing the buffer layer 2 so that the high concentration n-type semiconductor region 21 is diffused up to the upper major surface of the finally formed buffer layer 2.

17. Embodiment 17

Figure 34:
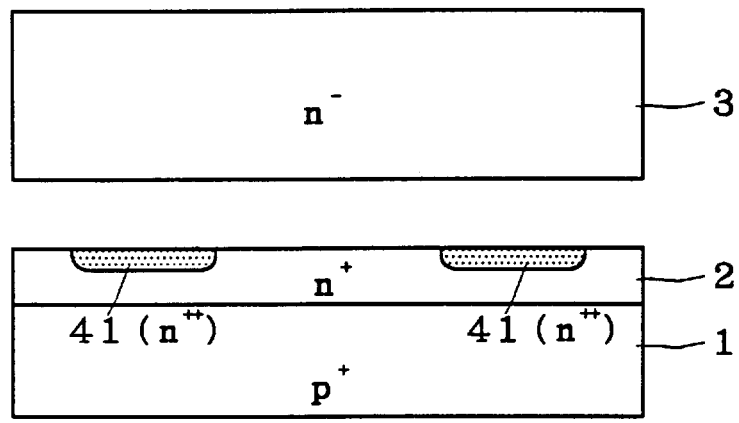
FIG. 34 is a step diagram showing a fabrication method according to an embodiment 17.

FIG. 34 is a fabrication step diagram showing a step of a further embodiment which is suitable for fabricating the device of the embodiment 5, i.e., such a device that the high concentration n-type semiconductor region 21 is formed on the boundary between the buffer layer 2 and the n-type semiconductor layer 3.

In order to fabricate this device, the steps of FIGS. 20 and 21 are first executed, for forming one semiconductor substrate shown in FIG. 34, i.e., a substrate having a p-type semiconductor layer 1, a buffer layer 2, and an n-type semiconductor region 41. In parallel with or around these steps, the step shown in FIG. 23, i.e., a step of preparing another semiconductor substrate corresponding to the n-type semiconductor layer 3 is executed.

Then, the semiconductor substrates are bonded with each other through the direct bonding technique, as shown in FIG. 34. Consequently, the structure shown in FIG. 22 is finished. Due to a heat treatment following the direct bonding, the n-type impurity in the n-type semiconductor region 41 is diffused in the periphery, whereby a high concentration n-type semiconductor region 21 is formed to extend along the boundary between the buffer layer 2 and the n-type semiconductor layer 3, as shown in FIG. 22.

Subsequent steps are similar to those of the embodiment 9. Further, the condition related to the shape of the mask 61 to be prepared, the concentration of the introduced n-type impurity and the like are also similar to those of the embodiment 9. In addition, the device 106 of the embodiment 6 can be fabricated by thinly depositing the buffer layer 2 so that the high concentration n-type semiconductor region 21 is diffused up to the lower major surface of the finally formed buffer layer 2.

18. Embodiment 18

Figure 35:
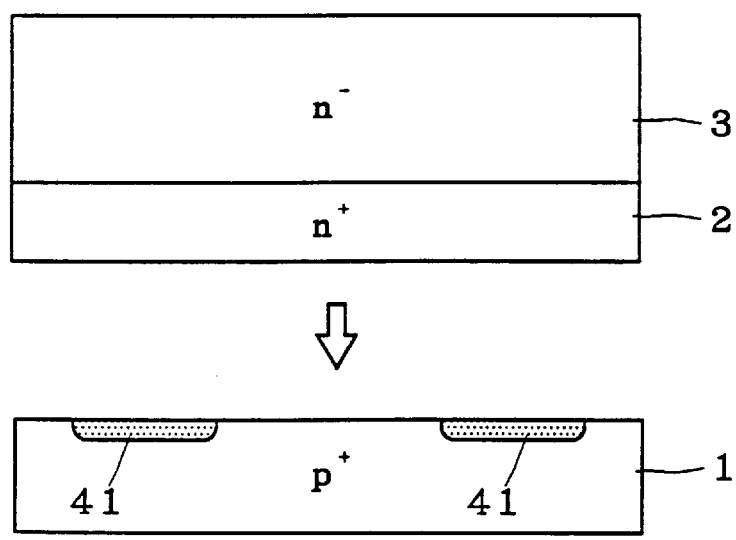
FIG. 35 is a step diagram showing a fabrication method according to an embodiment 18.

FIG. 35 is a fabrication step diagram showing a step of a further embodiment which is suitable for fabricating the device of the embodiment 1 to 4 and 8, i.e., such a device that the high concentration n-type semiconductor region 21 is formed on the boundary (junction plane) between the buffer layer 2 and the p-type semiconductor layer 1. In order to fabricate this device, the steps of FIGS. 16 and 17 are first executed, for forming one semiconductor substrate shown in FIG. 35, i.e., a substrate having a p-type semiconductor layer 1 and an n-type semiconductor region 41.

In parallel with or around these steps, the steps shown in FIGS. 23 and 24 are executed, thereby forming another semiconductor substrate shown in FIG. 35, i.e., a substrate having a buffer layer 2 and an n-type semiconductor layer 3.

Then, the semiconductor substrates are bonded with each other through the direct bonding technique, as shown in FIG. 35. Consequently, the structure shown in FIG. 19 is finished. Due to a heat treatment following the direct bonding, the n-type impurity in the n-type semiconductor region 41 is diffused in the periphery, whereby a high concentration n-type semiconductor region 21 is formed to extend over the boundary between the buffer layer 2 and the p-type semiconductor layer 1, as shown in FIG. 19.

Subsequent steps are similar to those of the embodiment 9. Further, the condition related to the shape of the mask 61 to be prepared, the concentration of the introduced n-type impurity and the like are also similar to those of the embodiment 9. In addition, the device 106 of the embodiment 6 can be fabricated by thinly depositing the buffer layer 2 so that the high concentration n-type semiconductor region 21 is diffused up to the upper major surface of the buffer layer 2.

19. Modification

Each of the above embodiments has been described with reference to such an IGBT that a MOS structure is formed on one major surface portion of a semiconductor body 12. In general, however, the effects related to the saturation voltage $V_{CE}(\text{sat})$ and the fall time $t_f$ are similarly expected even if the semiconductor body 12 has no MOS structure. Namely, the saturation voltage $V_{CE}(\text{sat})$ and the fall time $t_f$ can be compatibly improved by newly providing a high concentration n-type semiconductor region 21 or a damage region 2 satisfying the conditions shown in FIG. 5, so far as the semiconductor device has a bipolar structure which is formed by a p-type semiconductor layer 1, a buffer layer 2, an n-type semiconductor layer 3 and a p-type base layer 4.

Therefore, the present invention is also executable as to an SIT or a GTO, for example, in addition to a device having a MOS structure such as an IGBT, an MCT or an EST. Further, the bipolar structure provided in such a semiconductor device is not restricted to the pnp type illustrated in each embodiment, but may be of an npn type. For example, the present invention is also applicable to a p-channel IGBT which is formed by reversing the conductivity types of the respective semiconductor layers in the n-channel IGBT illustrated in each embodiment.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising a semiconductor body having a pair of major surfaces and a pair of main electrodes being connected to said pair of major surfaces respectively, said semiconductor body including a bipolar structure, wherein:

said bipolar structure has a first semiconductor layer of first conductivity type, second and third semiconductor layers of second conductivity type, and a fourth semiconductor layer of first conductivity type being successively stacked from first to second ones of said pair of major surfaces, said third semiconductor layer having a thickness L, wherein said fourth layer is separated into portions having centers, said centers being each separated by a predetermined distance;

the concentration of a second conductivity type impurity in said second semiconductor layer is higher than that in said third semiconductor layer; and said bipolar structure further comprises, a semiconductor region having a shorter carrier lifetime than that in said second semiconductor layer, said semiconductor region is selectively formed to have a distance D from another semiconductor region and a width W along said pair of major surfaces to be at least partially overlapped with or to be adjacent to said second semiconductor layer, and a relative distance value D/L equal to the distance D divided by the thickness L and a relative width W/L equal to the width W divided by the thickness L defining a two-dimensional space, wherein said distance D, said width W, and said thickness L have respective values within a region of the two-dimensional space bounded by, but not containing, a first segment having respective coordinates (0, 0.12) and (0.22, 0.44) and a second segment having respective coordinates (0,0) and (0.22,0), and a combined distance of said distance D and said width W being less than said predetermined distance of respective portions of the fourth semiconductor layer.

2. The semiconductor device in accordance with claim 1, wherein said distance D, said width W, and said thickness L have respective values within another region bounded by, but not containing, a third segment having respective coordinates (0,0.04) and (0.22,0.42) and a fourth segment having respective coordinates (0,0) and (0.22,0.22).

3. The semiconductor device in accordance with claim 1, wherein
said fourth semiconductor layer is selectively formed in the shape of a strip being parallel to said second major surface, and
said semiconductor region is formed in the shape of a plurality of strips being arranged in parallel with each other, to two-level-cross with strip-shaped said fourth semiconductor layer.

4. The semiconductor device in accordance with claim 1, wherein
said fourth semiconductor layer is selectively formed in the shape of a strip being parallel to said second major surface, and
said semiconductor region is formed in the shape of island regions isolated from each other and arranged in a matrix configuration.

5. The semiconductor device in accordance with claim 1, wherein
said fourth semiconductor layer is selectively formed in the shape of a strip being parallel to said second major surface, and
said semiconductor region is formed in the shape of a cross stripe.

6. The semiconductor device in accordance with claim 1, wherein said semiconductor body further comprises a fifth semiconductor layer of second conductivity type being selectively formed in said fourth semiconductor layer, and said semiconductor device further comprises:
a gate electrode being opposed to a channel region through an insulating film, said channel region being a surface part of said fourth semiconductor layer held between said third and fifth semiconductor layers.

7. The semiconductor device in accordance with claim 1, wherein
said semiconductor region is a second conductivity type region having a higher impurity concentration than that in said second semiconductor layer.

8. The semiconductor device in accordance with claim 7, wherein
an impurity concentration in said second semiconductor layer is in the range of about $5 \times 10^{14}$ cm$^{-3}$ to about $1 \times 10^{17}$ cm$^{-3}$,
an impurity concentration in said third semiconductor layer is below about $1 \times 10^{14}$ cm$^{-3}$, and
an impurity concentration in said semiconductor region is in the range of about $1 \times 10^{18}$ cm$^{-3}$ to about $1 \times 10^{21}$ cm$^{-3}$.

9. The semiconductor device in accordance with claim 1, wherein said semiconductor region is a region into which a crystal defect is introduced by irradiation with particles.

10. A semiconductor device comprising a semiconductor body having a pair of major surfaces and a pair of main electrodes being connected to said pair of major surfaces respectively, said semiconductor body including a bipolar structure, wherein:

said bipolar structure has a first semiconductor layer of first conductivity type, second and third semiconductor layers of second conductivity type, and a fourth semiconductor layer of first conductivity type being successively stacked from first to second ones of said pair of major surfaces, said third semiconductor layer having a thickness L, the concentration of a second conductivity type impurity in said second semiconductor layer is higher than that in said third semiconductor layer, and said bipolar structure further comprises, a semiconductor region having a shorter carrier lifetime than that in said second semiconductor layer, said semiconductor region is selectively formed to have a distance D from another semiconductor region and a width W along said pair of major surfaces to be at least partially overlapped with or to be adjacent to said second semiconductor layer, and a relative distance value D/L equal to the distance D divided by the thickness L and a relative width W/L equal to the width W divided by the thickness L defining a two-dimensional space, wherein said distance D, said width W, and said thickness L have respective values within a region of the two-dimensional space bounded by, but not containing, a first segment having respective coordinates (0, 0.12) and (0.22, 0.44) and a second segment having respective coordinates (0,0) and (0.22, 0), said semiconductor body further comprises a fifth semiconductor layer of second conductivity type being selectively formed in said fourth semiconductor layer, said semiconductor device further comprises:
a gate electrode being opposed to a channel region through an insulating film, said channel region being a surface part of said fourth semiconductor layer held between said third and fifth semiconductor layers, a trench is formed which opens to said second one of said pair of major surfaces and penetrates said fourth and fifth semiconductor layers, said channel region is exposed to a side wall of said trench, said insulating film covers an inside wall of said trench, and said gate electrode is buried into said trench on said insulating film.

11. The semiconductor device in accordance with claim 10, wherein said distance D, said width W, and said thickness L have respective values within another region bounded by, but not containing, a third segment having respective coordinates (0, 0.04) and (0.22, 0.42) and a fourth segment having respective coordinates (0,0) and (0.22, 0.22).

12. The semiconductor device in accordance with claim 10, wherein said semiconductor region is a second conductivity type region having a higher impurity concentration than that in said second semiconductor layer.

13. The semiconductor device in accordance with claim 12, wherein an impurity concentration in said second semiconductor layer is in the range of about $5 \times 10^{14}$ cm$^{-3}$ to about $1 \times 10^{17}$ cm$^{-3}$, an impurity concentration in said third semiconductor layer is below about $1 \times 10^{14}$ cm$^{-3}$, and an impurity concentration in said semiconductor region is in the range of about $1 \times 10^{18}$ cm$^{-3}$ to about $1 \times 10^{21}$ cm$^{-3}$.

14. The semiconductor device in accordance with claim 10, wherein said semiconductor region is a region into which a crystal defect is introduced by irradiation with particles.

15. A semiconductor device comprising:

a semiconductor body having, a pair of major surfaces, a pair of main electrodes being connected to said pair of major surfaces respectively, and a bipolar structure having, a first semiconductor layer of first conductivity type, second and third semiconductor layers of second conductivity type, and a fourth semiconductor layer of first conductivity type being successively stacked from first to second ones of said pair of major surfaces, said third semiconductor layer having a thickness L, wherein the concentration of a second conductivity type impurity in said second semiconductor layer is higher than that in said third semiconductor layer; and said bipolar structure fuirther comprises, a semiconductor region having a shorter carrier lifetime than that in said second semiconductor layer, said semiconductor region is selectively formed to have a distance D from another semiconductor region and a width W along said pair of major surfaces to be at least partially overlapped with or to be adjacent to said second semiconductor layer, and a relative distance value D/L equal to the distance D divided by the thickness L and a relative width W/L equal to the width W divided by the thickness L defining a two-dimensional space, wherein said distance D, said width W, and said thickness L have respective values within a region of the two-dimensional space bounded by, but not containing, a first segment having respective coordinates (0, 0.12) and (0.22, 0.44) and a second segment having respective coordinates (0,0) and (0.22,0).

16. The semiconductor device of claim 15, wherein:

said distance D, said width W, and said thickness L have respective values within another region bounded by, but not containing, a third segment having respective coordinates (0, 0.04) and (0.22, 0.42) and a fourth segment having respective coordinates (0,0) and (0.22, 0.22).

17. The semiconductor device of claim 15, wherein:

said semiconductor region is a second conductivity type region having a higher impurity concentration than that in said second semiconductor layer.

18. The semiconductor device of claim 17, wherein:

an impurity concentration in said second semiconductor layer is in the range of about $5 \times 10^{14}$ cm$^{-3}$ to about $1 \times 10^{17}$ cm$^{-3}$, an impurity concentration in said third semiconductor layer is below about $1 \times 10^{14}$ cm$^{-3}$, and an impurity concentration in said semiconductor region is in the range of about $1 \times 10^{18}$ cm$^{-3}$ to about $1 \times 10^{21}$ cm$^{-3}$.

19. The semiconductor device of claim 15, wherein:

said semiconductor region is a region into which a crystal defect is introduced by irradiation with particles.

20. The semiconductor device of claim 15, further comprising:

a fifth semiconductor layer of second conductivity type being selectively formed in said fourth semiconductor layer, a gate electrode being opposed to a channel region through an insulating film, said channel region being a surface part of said fourth semiconductor layer held between said third and fifth semiconductor layers, a trench being formed that opens to said second one of said pair of major surfaces and penetrates said fourth and fifth semiconductor layers, said channel region being exposed to a side wall of said trench, said insulating film covering an inside wall of said trench, and said gate electrode being buried into said trench on said insulating film.

21. The semiconductor device of claim 15, wherein:

said fourth layer being segmented into portions; and a combined distance of said distance D and said with W not being restricted by a distance separating respective portions of the fourth semiconductor layer.

* * * * *